(12) United States Patent
Taylor, Jr. et al.

(10) Patent No.: US 10,720,781 B2
(45) Date of Patent: Jul. 21, 2020

(54) SWITCHING PROTECTION SYSTEM

(71) Applicant: Ardent Edge, LLC, Charlotte, NC (US)

(72) Inventors: Clayborne Dudley Taylor, Jr., Charlotte, NC (US); Michael Edward Brandt, Concord, NC (US)

(73) Assignee: Ardent Edge, LLC, Charlotte, NC (US)

( * ) Notice: Subject to any disclaimer, the term of this patent is extended or adjusted under 35 U.S.C. 154(b) by 0 days.

(21) Appl. No.: 16/162,188

(22) Filed: Oct. 16, 2018

(65) Prior Publication Data

US 2019/0115768 A1    Apr. 18, 2019

Related U.S. Application Data

(60) Provisional application No. 62/572,826, filed on Oct. 16, 2017, provisional application No. 62/581,971, filed on Nov. 6, 2017.

(51) Int. Cl.
*H02J 7/00*     (2006.01)
*H01M 10/44*    (2006.01)
(Continued)

(52) U.S. Cl.
CPC ...... *H02J 7/0016* (2013.01); *G01R 19/16542* (2013.01); *H01M 2/1077* (2013.01);
(Continued)

(58) Field of Classification Search
USPC .................. 320/116, 117, 118, 122
See application file for complete search history.

(56) References Cited

U.S. PATENT DOCUMENTS

2001/0019256 A1 * 9/2001 Olsson ............... H02J 7/0016
                                                     320/118
2005/0083016 A1 * 4/2005 Yau .................. H02J 7/0016
                                                     320/116
(Continued)

FOREIGN PATENT DOCUMENTS

CN       201122645         9/2008
CN       206611054 U      11/2017
(Continued)

OTHER PUBLICATIONS

Patent Cooperation Treaty; International Search Report and Written Opinion, cited in PCT/US2018/056125; dated May 13, 2019.
(Continued)

*Primary Examiner* — Brian Ngo
(74) *Attorney, Agent, or Firm* — Moore & Van Allen PLLC; Peter B. Stewart

(57) ABSTRACT

Embodiments of the present invention are directed to a cell protection system that may be employed in high voltage systems such as grid scale energy storage systems. In some embodiments, the advanced cell protection system includes a proactive balancing system for balancing one or more battery units of the energy storage systems. In some embodiments, the advanced cell protection system includes a switching protection system for safely connecting and disconnecting the one or more battery units of the energy storage systems to other systems. In some embodiments, the advanced cell protection system includes an isolated communication system for allowing the one or more battery units to safely communicate with each other and at least one controller of the energy storage system.

11 Claims, 20 Drawing Sheets

(51) Int. Cl.
*H02J 7/02* (2016.01)
*H02J 3/32* (2006.01)
*G01R 19/165* (2006.01)
*H01M 10/42* (2006.01)
*H01M 2/10* (2006.01)
*H01M 10/48* (2006.01)

(52) U.S. Cl.
CPC ..... *H01M 10/425* (2013.01); *H01M 10/4207* (2013.01); *H01M 10/44* (2013.01); *H01M 10/482* (2013.01); *H02J 3/32* (2013.01); *H02J 7/0014* (2013.01); *H02J 7/0021* (2013.01); *H02J 7/0026* (2013.01); *H02J 7/0047* (2013.01); *H02J 7/0068* (2013.01); *H02J 7/022* (2013.01); *H02J 7/027* (2013.01); *H01M 10/4257* (2013.01); *H01M 2010/4271* (2013.01); *H01M 2010/4278* (2013.01); *H02J 7/0048* (2020.01)

(56) References Cited

U.S. PATENT DOCUMENTS

| | | | |
|---|---|---|---|
| 2006/0217058 | A1 | 9/2006 | Staszesky et al. |
| 2009/0066291 | A1 | 3/2009 | Tien et al. |
| 2009/0218997 | A1 | 9/2009 | Hey et al. |
| 2010/0237829 | A1 | 9/2010 | Tatebayashi |
| 2011/0279085 | A1* | 11/2011 | Shigemizu .......... H01M 10/441 320/117 |
| 2012/0299557 | A1 | 11/2012 | Kwon et al. |
| 2012/0306448 | A1 | 12/2012 | Lu et al. |
| 2012/0319658 | A1 | 12/2012 | White et al. |
| 2013/0020880 | A1 | 1/2013 | Asai et al. |
| 2013/0193926 | A1 | 8/2013 | Kluthe et al. |
| 2014/0302352 | A1 | 10/2014 | Lenz et al. |
| 2017/0176551 | A1* | 6/2017 | Deunsing ............. G01R 33/288 |
| 2018/0314349 | A1 | 11/2018 | Jiang et al. |
| 2019/0115631 | A1 | 4/2019 | Taylor, Jr. et al. |

FOREIGN PATENT DOCUMENTS

| | | |
|---|---|---|
| EP | 2565959 | 3/2013 |
| WO | WO 2015/121564 | 8/2015 |

OTHER PUBLICATIONS

Patent Cooperation Treaty; Invitation to Pay Additional Fees and, Where Applicable Protest Fee; Partial Search Report dated Jan. 24, 2019; cited in PCT/US2018/056125; 54 pages.

"Battery Management System"; Wikipedia, retrieved from the internet on Jan. 29, 2019; https://en.wikipedia.org/wiki/battery_management_system, 5 pages.

M. Muneeb et al.; "Modular Approach for Continuous Cell-Level Balancing to Improve Performance of Large Battery Packs" IEEE Energy Conversion Congress and Exposition, Pittsburgh, Pennsylvania, Sep. 14-18, 2014; 10 pages.

* cited by examiner

SWITCHING PROTECTION SYSTEM

CROSS REFERENCE OF RELATED APPLICATIONS

This application claims priority to U.S. Provisional Patent Application Ser. No. 62/572,826, filed Oct. 16, 2017, entitled "Cell Protection System for a Grid Scale Energy Storage System," the entirety of which is incorporated herein by reference. This application claims priority to U.S. Provisional Patent Application Ser. No. 62/581,971, filed Nov. 6, 2017, entitled "Passive High Voltage Isolated Communication Circuit," the entirety of which is incorporated herein by reference.

FIELD OF THE INVENTION

The present invention relates to a cell protection system that may be employed in high voltage systems (e.g., grid scale energy storage systems).

SUMMARY

The following presents a simplified summary of one or more embodiments of the invention in order to provide a basic understanding of such embodiments. This summary is not an extensive overview of all contemplated embodiments, and is intended to neither identify key or critical elements of all embodiments, nor delineate the scope of any or all embodiments. Its sole purpose is to present some concepts of one or more embodiments in a simplified form as a prelude to the more detailed description that is presented later.

In one aspect, the present invention is directed to a system comprising a plurality of battery units connected in series and a plurality of bypass circuits, each bypass circuit being in parallel to one of the battery units, wherein the system is configured to activate a first bypass circuit of the plurality of bypass circuits, the first bypass circuit being in parallel to a first battery unit of the plurality of battery units, wherein the first bypass circuit is activated based on a state of charge of the first battery unit, wherein upon activation of the first bypass circuit, current flows through the first bypass circuit and does not flow to the first battery unit.

In an embodiment, the balancing system deactivates the first bypass circuit based on a state of charge of the first battery unit, wherein upon deactivation of the first bypass circuit, the current flows through the first battery unit and does not flow through the first bypass circuit.

In an embodiment, the balancing system activates the first bypass circuit by determining the state of charge of the first battery unit, determining that the state of charge of the first battery unit is not equal to a state of charge associated with other battery units of the plurality of battery units, and in response to identifying that the state of charge of the first battery unit is not equal to the state of charge of the other battery units, activating the first bypass circuit.

In an embodiment, the balancing system deactivates the first bypass circuit by determining the state of charge of the first battery unit, determining that the state of charge of the first battery unit is equal to a state of charge of other battery units of the plurality of battery units, and in response to identifying that the state of charge of the first battery unit is equal to the state of charge of the other battery units, deactivating the first bypass circuit.

In an embodiment, the balancing system further comprises a controller, wherein the controller is configured to activate and deactivate the first bypass circuit.

In an embodiment, the balancing system further comprises a voltage comparator, wherein the voltage comparator is configured to activate and deactivate the first bypass circuit in response to a voltage of the first battery unit.

In an embodiment, the balancing system activates the first bypass circuit based on the state of charge of the first battery unit comprises activating the first bypass circuit based on a voltage of the first battery unit.

In an embodiment, the balancing system comprises a plurality of battery units connected in series and a plurality of bypass circuits, each bypass circuit being in parallel to one of the battery units, wherein each of the plurality of bypass circuits comprises at least one voltage comparator and at least one semiconductor switch, wherein a first voltage comparator associated with a first bypass circuit of a first battery unit is configured to activate a first semiconductor switch to activate the first bypass circuit, the first bypass circuit being in parallel to a first battery unit of the plurality of battery units, wherein the first bypass circuit is activated based on a state of charge of the first battery unit, wherein upon activation of the first bypass circuit, current flows through the first bypass circuit and does not flow to the first battery unit.

In another aspect, the present invention is directed to a protection system that comprises a bridge circuit configured to be connected between the bus and the one or more battery units, wherein the bridge circuit comprises a first electrical path configured to be connected between a positive terminal of the bus and a positive terminal of the one or more battery units, the first electrical path comprising a first switch, a second electrical path configured to be connected between a negative terminal of the bus and a negative terminal of the one or more battery units, the second electrical path comprising a second switch, a third electrical path connected in parallel to the first electrical path between the positive terminal of the bus and the positive terminal of the one or more battery units, the third electrical path comprising a third switch and an inductor, at least one controller connected to the bridge circuit, wherein the at least one controller is configured to control a switching frequency of the third switch in order to control an impedance of the inductor while (i) connecting the one or more battery units to the bus via the bridge circuit or (ii) disconnecting the one or more battery units from the bus.

In an embodiment, the at least one controller of the protection system is configured to control the switching frequency of the third switch in order to control the impedance of the inductor while connecting the one or more battery units to the main bus via the bridge circuit by changing the third switch from an OFF state to a SWITCHING state, controlling the switching frequency of the third switch to control the impedance of the inductor for gradually increasing a flow of current between the one or more battery units and the main bus, and closing of the first switch of the first electrical path between the positive terminal of the bus and the positive terminal of the one or more battery units.

In an embodiment of the present invention, the at least one controller controls the switching frequency of the third switch to control the impedance of the inductor to be at a first value and subsequently decrease the impedance of the inductor to a second value.

In an embodiment of the present invention, the at least one controller of the protection system is further configured to change the third switch from the SWITCHING state to the OFF state, and opening a fourth switch of the third electrical path.

In an embodiment of the present invention, the at least one controller of the protection system is configured to control the switching frequency of the third switch in order to control the impedance of the inductor while disconnecting the one or more battery units from the main bus by changing the third switch from an OFF state to an ON state, opening the first switch, changing the third switch from the ON state to a SWITCHING state, controlling the switching frequency of the third switch to increase the impedance of the inductor, and changing the third switch from the SWITCHING state to the OFF state.

In an embodiment of the present invention, the bridge circuit of the protection system further comprises a fourth electrical path connected in parallel to the second electrical path between the negative terminal of the bus and the negative terminal of the one or more battery units, the fourth electrical path comprising a fourth switch the inductor of the third electrical path, wherein the at least one controller of the protection system is further configured to change the fourth switch from an OFF state to an ON state, open the second switch, change the fourth switch from the ON state to a SWITCHING state, control the switching frequency of the fourth switch to increase the impedance of the inductor for decreasing a flow of current between the one or more battery units and the main bus, and change the fourth switch from the SWITCHING state to the OFF state.

In an embodiment of the present invention, the fourth electrical path does not comprise the third switch of the third electrical path.

In an embodiment of the present invention, the present invention is directed to a protection system that comprises a bridge circuit configured to be connected between the bus and the one or more battery units, wherein the bridge circuit comprises a first electrical path configured to be connected between a positive terminal of the bus and a positive terminal of the one or more battery units, the first electrical path comprising a first switch, a second electrical path configured to be connected between a negative terminal of the bus and a negative terminal of the one or more battery units, the second electrical path comprising a second switch, a third electrical path connected in parallel to the first electrical path between the positive terminal of the bus and the positive terminal of the one or more battery units, the third electrical path comprising a first semiconductor switch and an inductor, at least one controller connected to the bridge circuit, wherein the at least one controller is configured to (1) to control a switching frequency of the third switch in order to control an impedance of the inductor while connecting the one or more battery units to the main bus via the bridge circuit by changing the third switch from an OFF state to a SWITCHING state, controlling a switching frequency of the third switch to control the impedance of the inductor for gradually increasing a flow of current between the one or more battery units and the main bus, and closing of the first switch of the first electrical path between the positive terminal of the bus and the positive terminal of the one or more battery units, or (2) control the switching frequency of the third switch in order to control the impedance of the inductor while disconnecting the one or more battery units from the main bus by changing the third switch from an OFF state to an ON state, opening the first switch, changing the third switch from the ON state to a SWITCHING state, controlling a switching frequency of the third switch to increase the impedance of the inductor, and changing the third switch from the SWITCHING state to the OFF state.

In another aspect, the present invention is directed to a system comprising a controller, a first battery unit in communication with the controller via a communication circuit, wherein the communication circuit comprises a first isolated communication circuit positioned between the controller and the first battery unit, the first isolated communication circuit comprising a first transmitting circuit for transmitting data signals wirelessly via a first capacitor and a first receiving circuit for receiving the data signals wirelessly transmitted by the first transmitting circuit.

In an embodiment, the first battery unit of the system comprises insulation, wherein at least a portion of the insulation functions as the first capacitor.

In an embodiment, the system further comprises a second battery unit in communication with the first battery unit and the controller, via the communication circuit, wherein the communication circuit further comprises a second isolated communication circuit positioned between the first battery unit and the second battery unit, the first isolated communication circuit comprising a second transmitting circuit for transmitting the data signals wirelessly via a second capacitor and a second receiving circuit for receiving the data signals wirelessly transmitted by the second transmitting circuit, wherein the communication circuit further comprises a third isolated communication circuit positioned between the second battery unit and the controller, the third isolated communication circuit comprising a third transmitting circuit for transmitting the data signals wirelessly via a third capacitor and a third receiving circuit for receiving the data signals wirelessly transmitted by the third transmitting circuit.

In an embodiment, the system of the present invention wirelessly transmits a first data signal comprising instructions for the first battery unit from the controller, via the communication circuit, to the first battery unit, wherein the first data signal is transmitted wirelessly between the first transmitting circuit and the first receiving circuit.

In an embodiment, the system of the present invention wirelessly transmits a second data signal comprising instructions for the second battery unit from the controller, via the communication circuit, to the second battery unit, wherein the second data signal is transmitted wirelessly between the first transmitting circuit and the first receiving circuit and between the second transmitting circuit and the second receiving circuit.

BRIEF DESCRIPTION OF THE DRAWINGS

The features and functions of the invention, and the manner in which the same are accomplished, will become more readily apparent upon consideration of the following detailed description of the invention taken in conjunction with the accompanying drawings, which illustrate preferred and exemplary embodiments and which are not necessarily drawn to scale, wherein.

DETAILED DESCRIPTION

Figure 1:
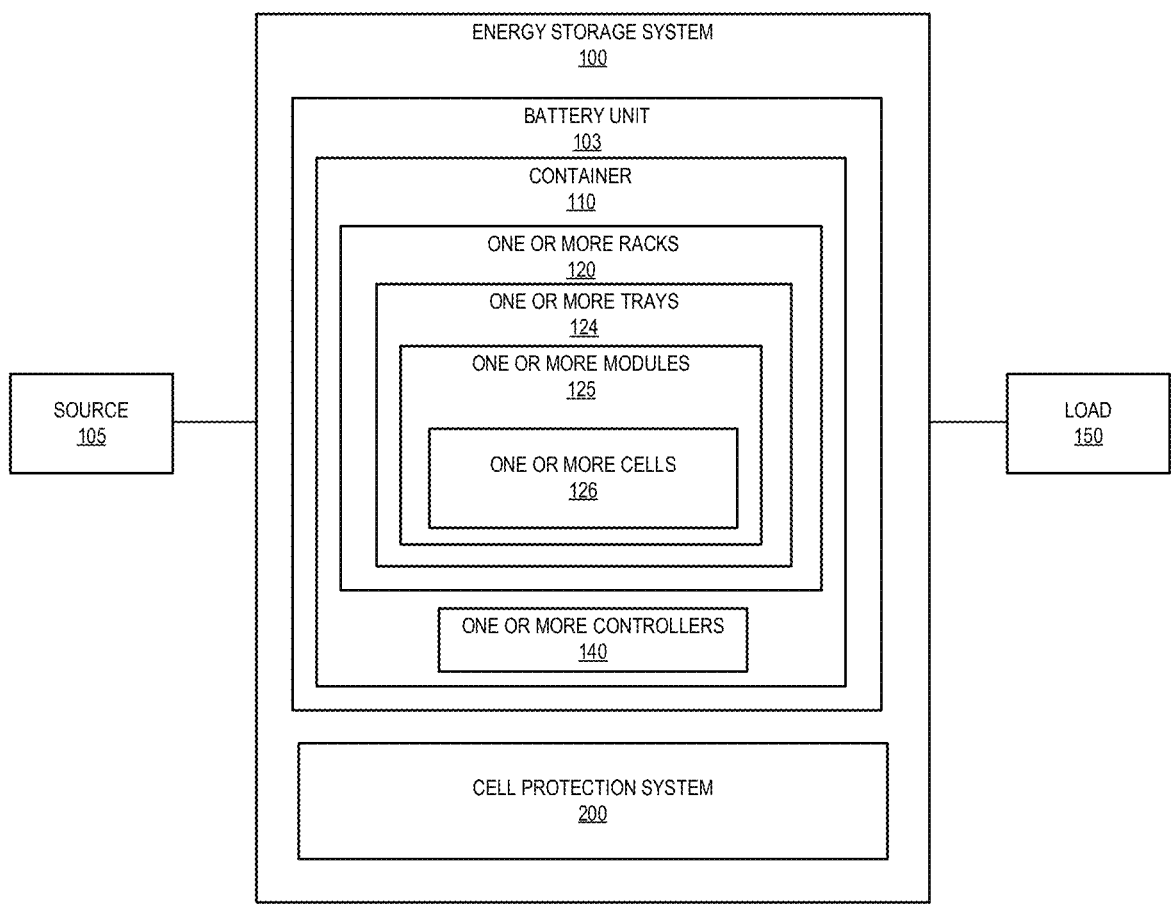
FIG. 1 illustrates a block diagram representing an energy storage system, in accordance with an embodiment of the present invention.

The present invention now will be described more fully hereinafter with reference to the accompanying drawings, in which some, but not all embodiments of the invention are shown. This invention may be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

The term "battery unit" as used herein may include any unit which stores energy. A battery unit may itself include multiple battery units. In one embodiment, a "battery unit" may include one or more individual cells. In one embodiment, a "battery unit" may include a bundle of cells. In one embodiment, a "battery unit" may include one or more modules. Each such modules may include a plurality of cells. In one embodiment, a "battery unit" may include one or more trays. Each such tray may include a plurality of modules, and each module may include one or more cells. In one embodiment, the term "battery unit" may include one or more racks. Each such rack may include a plurality of trays, each of the plurality of trays may include a plurality of modules, and each of the plurality of modules may include one or more cells. In one embodiment the term "battery unit" may include one or more containers, where each of the one or more containers includes a plurality of racks, where each of the plurality of racks includes a plurality of modules, where each of the plurality of modules includes a plurality of cells.

Electricity is generated at power plants using various forms of energy and is transmitted and distributed through complex systems. The electrical energy generated at the power plants may not be constant and the load to which the generated electrical energy is being supplied to may also not be constant. As such, energy storage systems are often used within electric power generation, transmission, and/or distribution systems (e.g., at substations) for storing energy for later usage during periods of peak demand and/or low supply of power. Energy storage systems comprise one or more battery units which store and discharge energy based on the load requirements and the supply of power. There are multiple challenges associated with energy storage systems and additional circuits are typically used to ensure that the energy storage systems function safely without encountering any damages and/or losses.

A challenge associated with energy storage systems is the balancing of the one or more battery units for the energy storage systems to function efficiently. The battery units in the energy storage systems often do not have identical capacity, charging rate, and discharging rate. As such, some of the battery units may reach full charging or discharging potential before the other battery units and passing current through a battery unit which is already at its full charging potential may be catastrophic to the battery units and systems which are connected to the battery units. Therefore, the current flowing through each of the battery units is typically regulated in order to avoid damage because of overcharging or over-draining of battery units. Conventional systems typically use passive balancing and active balancing methods for regulating current flowing through the battery units. However, each of these methods have significant drawbacks. In passive balancing methods, after identifying that one of the battery units is full, the charging of the not-full battery units is paused by stopping the supply of current to all the battery units while the battery unit which is full is allowed to drain (e.g., through a resistor) until the voltage or state of charge of all the battery units match. Such draining of full battery units during passive balancing results in a significant amount of energy wastage and increases the time taken by the battery units to reach their full potential. In active balancing methods, after identifying that a battery unit is full, the supply of current to the other battery units is turned off and the energy from the battery unit which is full is transferred to other battery units until the state of charge of all the battery units is equal. This balancing method is very expensive, highly complex to implement, and the time taken to transfer the energy between the battery units is high. Moreover, this kind of balancing method uses electronically controlled switches to facilitate transfer of energy and the operation of these switches introduces noise into the system to which the energy storage system is connected to.

Another challenge associated with the energy storage systems is connecting and disconnecting the energy storage systems to a power system. For example, an energy storage system may need to be disconnected from a power system to facilitate the maintenance or replacement of one or more battery units and then added back to the power system. Connecting or disconnecting a system to or from another system which is already energized can cause damage to both the systems and to the personnel around the systems if proper protection elements and safety procedures are not used. Different problems are associated with connecting and disconnecting systems. When connecting systems, a sudden inrush of current may occur, which is undesirable and can cause damage to the systems. When disconnecting systems, sudden interruption of current flowing in the systems can cause an arc flashover which can introduce faults into the systems and can cause damage to the systems. Typically, separate protection elements or switches are utilized for connecting and disconnecting systems. For example, a load break switch that can operate while current is flowing may be utilized for disconnecting a system from an already energized system. Such additional protection elements or switches are very expensive.

Yet another challenge faced by the energy storage systems is the communication between controllers used to control the operation of the battery units of an energy storage system. Conventional systems facilitate communication between multiple controllers and other devices of a power system via data cables (e.g., broadband cables), which run in parallel to the power lines. However, the low voltage data signals which are being communicated over the data cables are prone to interference from the high voltage power lines, thereby affecting the quality of the data signals. Some other conventional systems facilitate communication between multiple systems of a power system via power line communications. However, power lines are noisy environments for data communications due to noise that can be generated by loads, such as electrical motors and fluorescent lights, by radio signal interferences, and the like. Other problems related to power line communication may include signal attenuation and distortion, loss of data communication when there is an open circuit, lack of regulations for power line communication, and the like. Some existing systems use fiber optics to overcome the above mentioned problems. Although optical fibers can provide tremendous data transmission capabilities, they are very expensive and require more protection for an efficient transmission of data. As such, there exists a need for a cost effective solution to all the aforementioned problems.

In one aspect, the present invention is directed to a cell protection system that addresses the above mentioned problems existing in the space of energy storage systems. With respect to the first challenge discussed above, the cell protection system employs a proactive balancing scheme which utilizes a bypass mechanism connected to one or more battery units to regulate the current flowing through the one or more battery units by creating an alternate path for the current without having to stop the supply of current to all battery units. For example, while charging the one or more battery units, if a battery unit has reached 100% potential while the other battery units are at 50% potential, the cell protection system activates the bypass mechanism associated with the battery unit that is 100% full. The bypass mechanism allows the current to take an alternate path in order to bypass the battery unit that is 100% full and charge other battery units that are not full. This overcomes the problems presented by the conventional methods and allows the one or more battery units to charge and discharge at a faster rate.

With respect to the second challenge discussed above, different challenges are associated with connecting and disconnecting systems. As such, the cell protection system of the present invention operates a switching mechanism for connecting and disconnecting the battery units of the energy storage system to other systems. The cell protection system causes the switching mechanism to equalize the voltages between the battery units and the other systems before fully connecting the battery units, thereby minimizing the effects of the inrush current. The cell protection system causes the switching mechanism to gradually reduce the current flowing to and from the battery units before disconnecting the battery units completely, thereby minimizing the occurrence of the arc flashover.

With respect to the third problem discussed above, the cell protection system utilizes the insulation designed to withstand high voltages, for communicating data between the one or more battery units and the at least one controller of the energy storage system. Typically, the insulation used within the existing power systems has capacitance and can act as a capacitor. In general, the communication systems operate at very high frequencies and low power, current, and voltage levels and the power systems operate at very low frequencies and very high power, current, and voltage levels. The insulation used in the power systems block low frequency signals and are configured to operate at high frequency. As such, the cell protection system may use the existing insulation to wirelessly transmit communication signals without having to use additional expensive equipment such as data cables with additional insulation or optical fibers for transmitting communication signals in high voltage systems. Alternatively, coupling capacitors may be used instead of insulation to wirelessly transmit communication signals. The cell protection system transmits communication signals, via the coupling capacitors or insulation, by selecting an operating frequency for the communication signals so that they can easily propagate through and around the existing insulators such as the coupling capacitors and the like. For example, the insulation may allow only some signals which have a certain range of frequencies to pass through it. Therefore, the cell protection system tunes the communication signal to a frequency which allows the communication signal to pass through the insulation. This provides a cost effective solution to the problems encountered by the existing communication systems.

Although the cell protection system described herein is explained with respect to energy storage systems, the cell protection system may be used in other high voltage systems which employ battery units. In one exemplary embodiment, the cell protection system may be used within power conversion systems. One example of such power conversion system is described in detail in the U.S. Provisional Patent Application Ser. No. 62/746,154 entitled "Power Conversion System" filed on Oct. 16, 2018, which is incorporated by reference in its entirety herein.

FIG. 1 illustrates a block diagram representing an energy storage system 100. The energy storage system 100 typically comprises one or more battery units 103 and a cell protection system 200 as illustrated in FIG. 1. The energy storage system 100 is typically connected to a source 105 and a load 150 via a bus. In one embodiment, where the source 105 does not generate power to match the requirements of the load 150, the energy storage system 100 supplies the additional power needed to meet the requirements of the load 150 by discharging the battery units 103. In another embodiment, where the source 105 generates excess power which is less than the requirements of the load 150, the excess energy is stored in the energy storage system 100 by charging the one or more battery units of the energy storage system 100.

As illustrated in FIG. 1, each of the one or more battery units 103 of the energy storage system 100 may include a hierarchy of battery units. By way of example, the battery unit may comprise at least one container 110. The at least one container 110 may comprise one or more racks 120 connected in series. Each of the one or more racks 120 may comprise one or more trays 124 connected in series and each of the one or more trays 124 may comprise one or more modules 125 connected in series. Each of the one or more modules 125 may comprise one or more cells 126 grouped into bundles that are connected in series. The cells may be any type of cells usable for high power applications.

Each battery unit 103 may include one or more controllers 140 for controlling the operation of the battery unit 103. In some embodiments, the battery unit 103 may include one or more controllers for controlling different levels of battery units. For example, the battery unit 103 may include one or more controllers 140 at a rack level, tray level, module level, and/or cell level.

Figure 2:
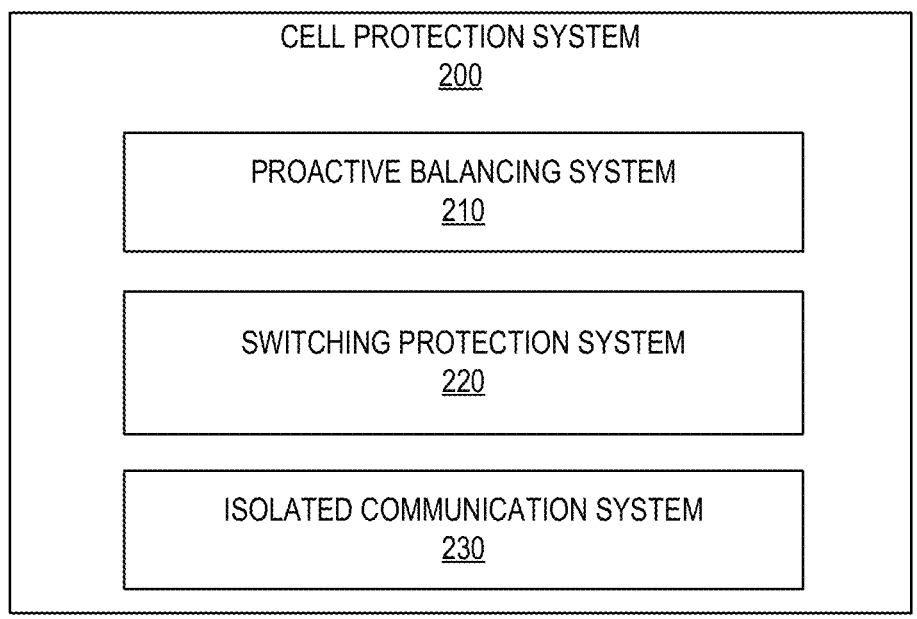
FIG. 2 illustrates a block diagram representing the cell protection system, in accordance with an embodiment of the present invention.

FIG. 2 illustrates a block diagram representing the cell protection system 200, in accordance with an embodiment of the present invention. As shown, the cell protection system 200 comprises a proactive balancing system 210 for balancing the one or more battery units within the energy storage system 100, a switching protection system 220 for disconnecting or connecting the energy storage system to a power system, and an isolated communication system 230 for allowing the one or more controllers 103 within the energy storage system 100 to communicate with each other and other devices within the energy storage system 100. The proactive balancing system 210, the switching protection system 220, and the isolated communication system 230 may be separate circuits or circuit elements connected to the one or more battery units of the energy storage system 100. The circuits, circuit elements, and functions of the proactive balancing system 210, the switching protection system 220, and the isolated communication system 230 are explained in detail below referring to FIGS. 3A-3F, FIGS. 4A-4H, FIGS. 5A-5H, and FIGS. 6A-6D.

The energy storage system 100 described herein may include one or more controllers. In some embodiments, there may be a centralized controller for controlling the one or more battery units 103 and the cell protection system 200. In some embodiments, there may be separate controllers for the one or more battery units 103 and the cell protection system 200. As mentioned above, in some embodiments, there may be one or more controllers at container level, rack level, tray level, module level, and/or cell level. In some embodiments, apart from the controllers associated with the one or more battery units 103, there may be additional controllers for each of the proactive balancing system 210, the switching protection system 220, and the isolated communication system 230. In some embodiments, the proactive balancing system 210, the switching protection system 220, and the isolated communication system 230 may have a single controller. In some embodiments, when reference is made to the one or more controllers, it should be understood that it may be a specific controller and does not include all controllers.

Although the cell protection system described herein is particularly advantageous to high voltage applications such as systems exceeding 10 kW, it should be understood that the cell protection system may be used in applications associated with other voltage levels.

FIG. 3A-3F illustrate exemplary functioning of the proactive balancing system 210 of FIG. 2, in accordance with an embodiment of the present invention. The proactive balancing system comprises a plurality of bypass circuits, each bypass circuit being configured to allow current to bypass a battery unit. Each of the plurality of bypass circuits may include a voltage comparator and a Metal-Oxide-Semiconductor Field-Effect Transistor (MOSFET). In some embodiments, the voltage comparator activates the bypass circuit based on the voltage levels of the battery units. The proactive balancing system 210 may further comprise one or more sensors such as a sensor to measure the voltage potential of the battery units and a sensor to measure the current of the battery units. The measurements associated with the one or more sensors may be used to measure the state of charge of the one or more battery units. In some embodiments, the proactive balancing system 210 may include at least one controller which controls the operation (e.g., activation and deactivation) of the bypass circuits.

Figure 3A:
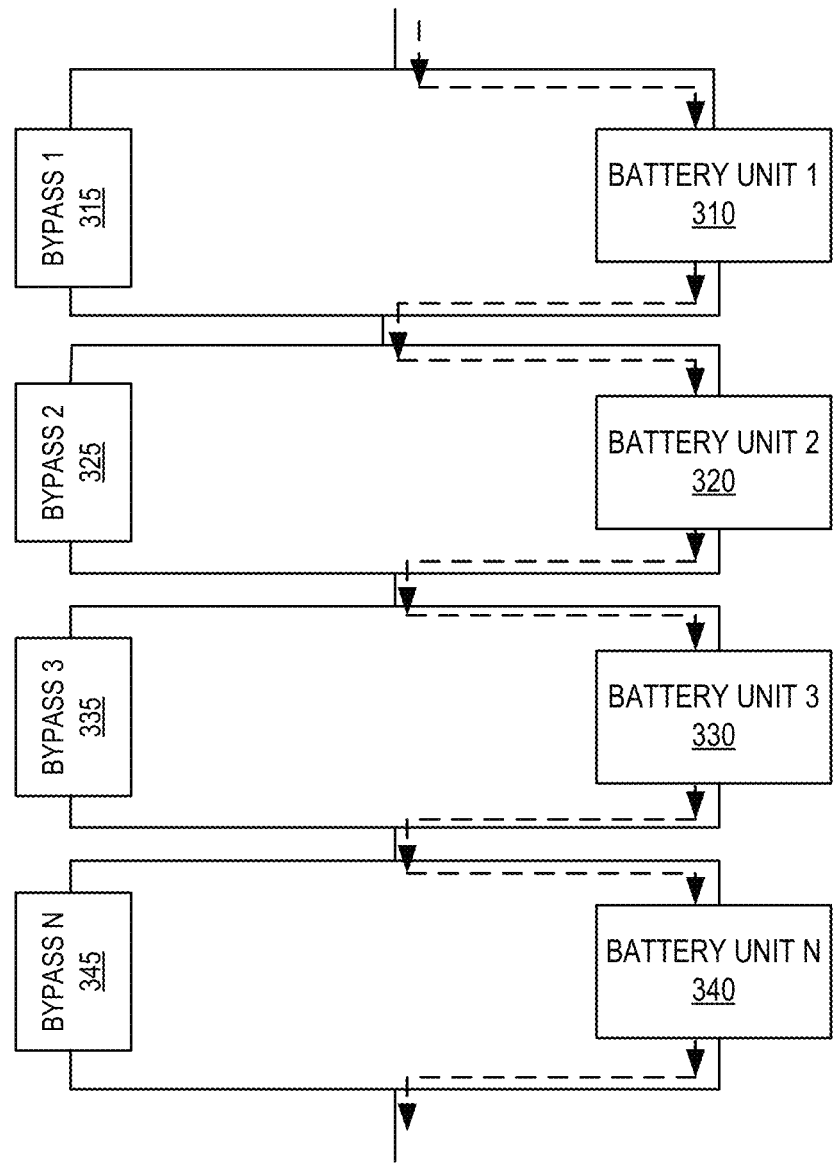
FIGS. 3A-3F illustrate exemplary functioning of a proactive balancing system of FIG. 2, in accordance with an embodiment of the present invention.

FIG. 3A illustrates the connection of the one or more battery units in the energy storage system 100 with the bypass circuits of the proactive balancing system 210 that may be used to equalize or balance the charge stored in the one or more battery units. As shown, each of the battery units (battery unit 1 310, battery unit 2, battery unit 3 330, through battery unit N 340) are connected in series and each of the battery units has a corresponding bypass connection (bypass 1 315, bypass 2, 325, bypass 3 335, through bypass N 345) connected in parallel to such battery unit. When each of the battery units are not fully charged, the current flows typically through each of the battery units (as represented by the dotted lines in the FIG. 3A), thereby charging each of the battery units. Each battery unit may be a rack, module, tray, and/or cell.

In some embodiments, the one or more battery units illustrated in FIG. 3A-3F may be lower level battery units such as the one or more trays, the one or more modules, and/or the one or more cells. In some embodiments, the bypass connections associated with the proactive balancing system 210 may be applied to higher level battery units including, trays, racks, and/or the like. The proactive balancing system 210 balances the one or more battery units in a way so as to efficiently utilize the supply of current which is being passed to the one or more battery units.

Figure 3B:
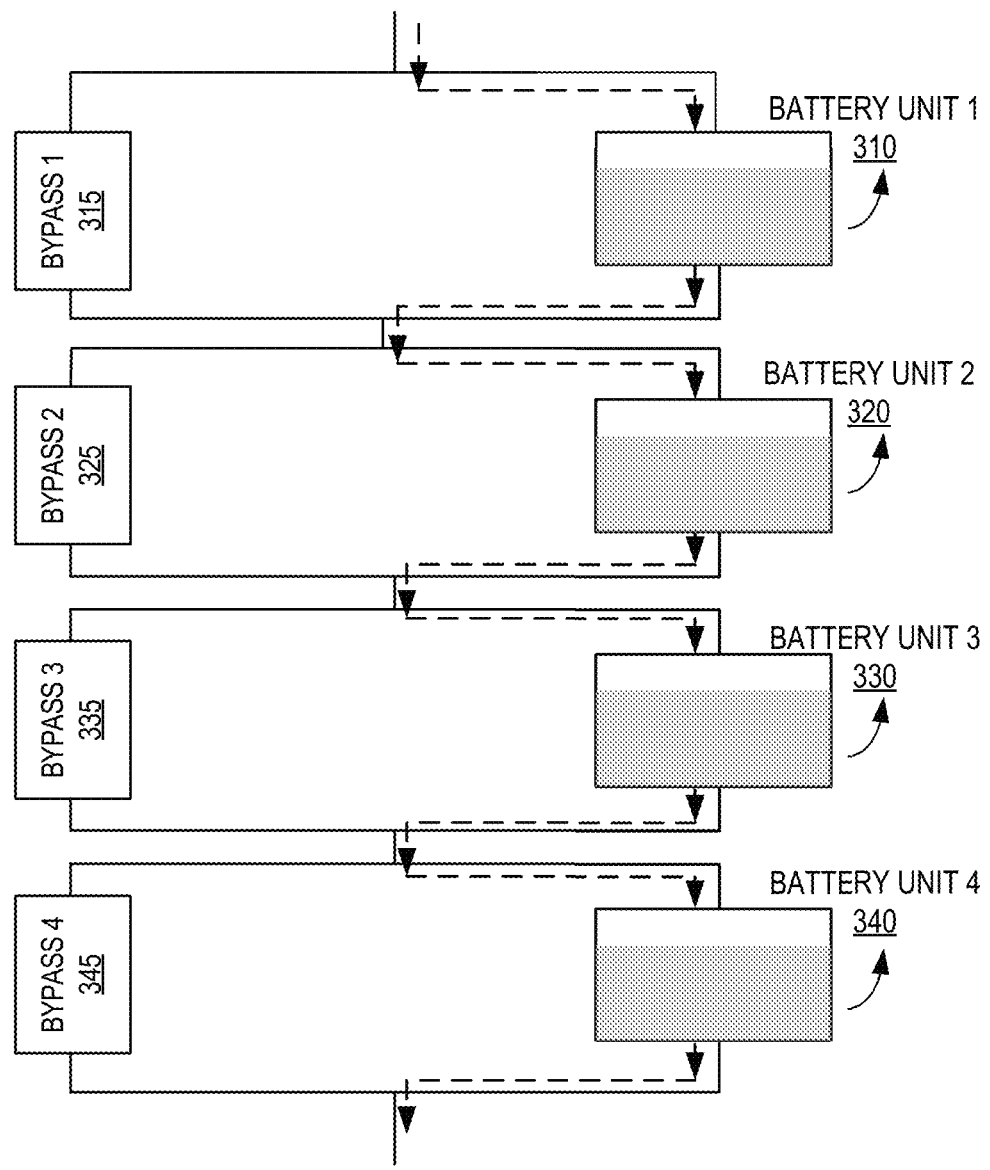
Figure 3C:
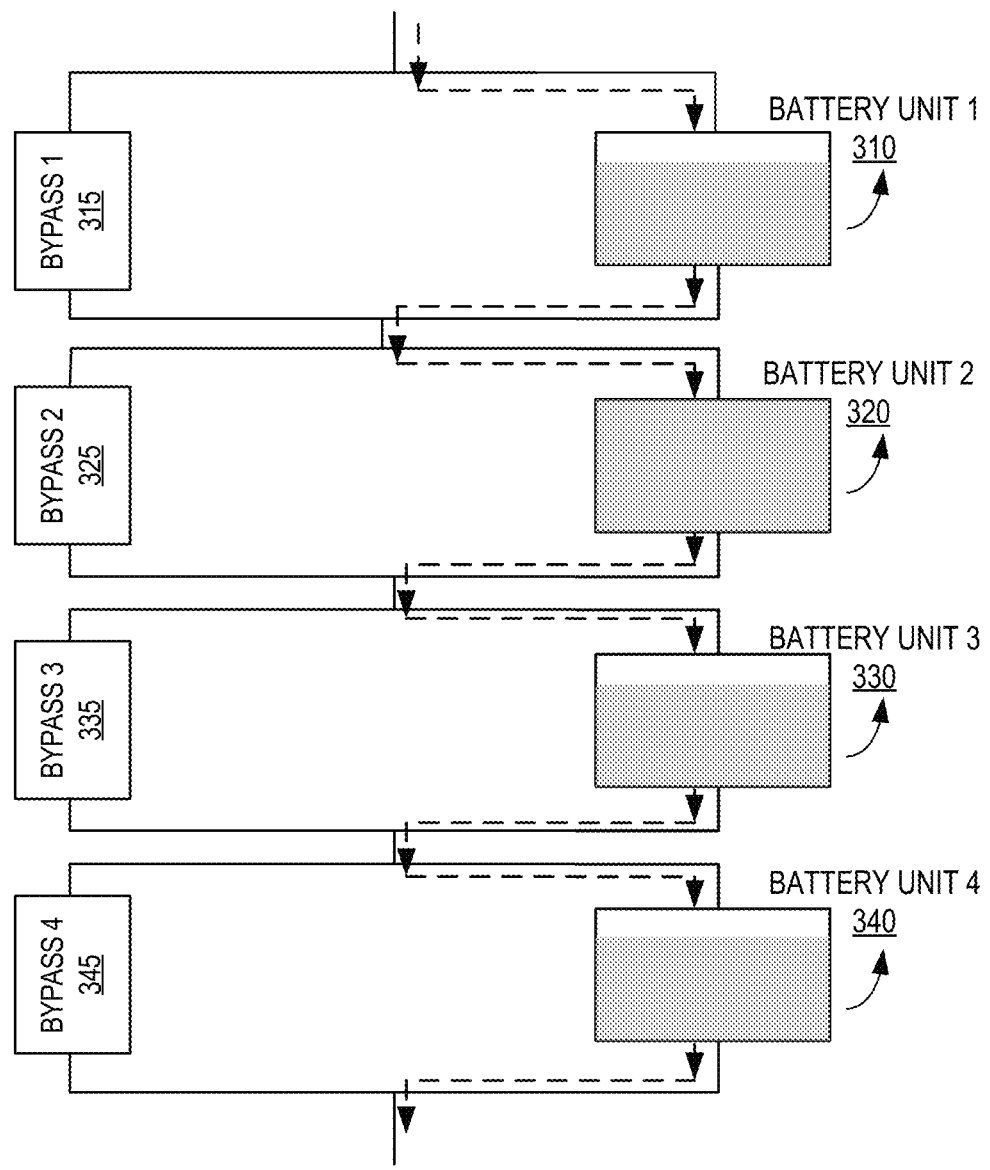
Figure 3D:
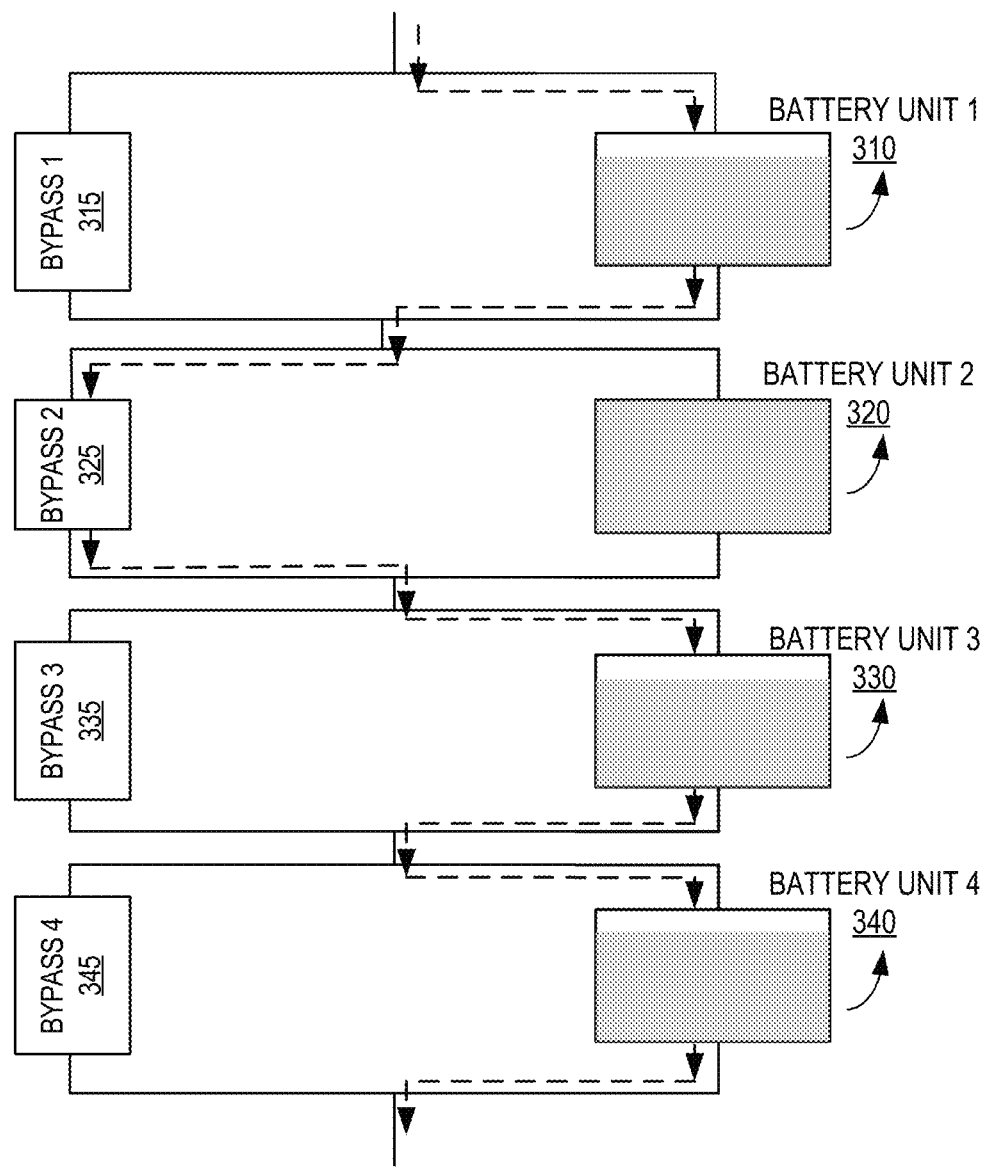

FIG. 3B illustrates the charging of the one or more battery units in the energy storage system 100. Subsequently, FIG. 3C illustrates, further charging of the battery units such that the illustrated battery units do not have identical states of charge, as the battery units may have different charging and discharging rates and/or capacities. As illustrated in FIG. 3D, the battery unit 2 320 is charged to substantially hundred percent of its potential, whereas the battery unit 1 310, the battery unit 3 330, and battery unit 4 340 are not charged to hundred percent of their potential.

FIG. 3D illustrates the activation of a bypass connection upon determining that a battery unit has been charged completely. Based on identifying that the battery unit 2 is substantially charged, the bypass 2 325 corresponding to the battery unit 2 320 is activated. As such, the path of the current is altered (as represented by the dotted line in FIG. 3D) so that the current bypasses the battery unit 2 320. The current continues to flow through and charge the other battery units (battery unit 1 310, the battery unit 3 330, and battery unit 4 340).

As mentioned above, each bypass may comprise a voltage comparator and a MOSFET. The voltage comparator may be configured to compare the voltage level of the corresponding battery unit to an expected charge value. In some embodiments, the expected charge value may be provided by the controller based on the voltage levels of the other battery units. In some embodiments, the voltage comparator directly communicates with an adjacent battery unit to determine if the voltage level of a battery unit is greater than or less than the voltage level of the adjacent battery unit. Once the voltage level of the battery unit equals or exceeds the expected charge value, the voltage comparator activates (e.g., automatically activates) the gate of the MOSFET to redirect the current to flow to the bypass instead of the battery unit. In other embodiments, a controller of the proactive balancing system 210 may activate the bypass based on determining a state of charge or voltage level of the applicable battery unit. The bypass allows the other battery units to charge until their voltage level match the voltage level of bypassed battery unit without having to stop the supply of current.

Figure 3E:
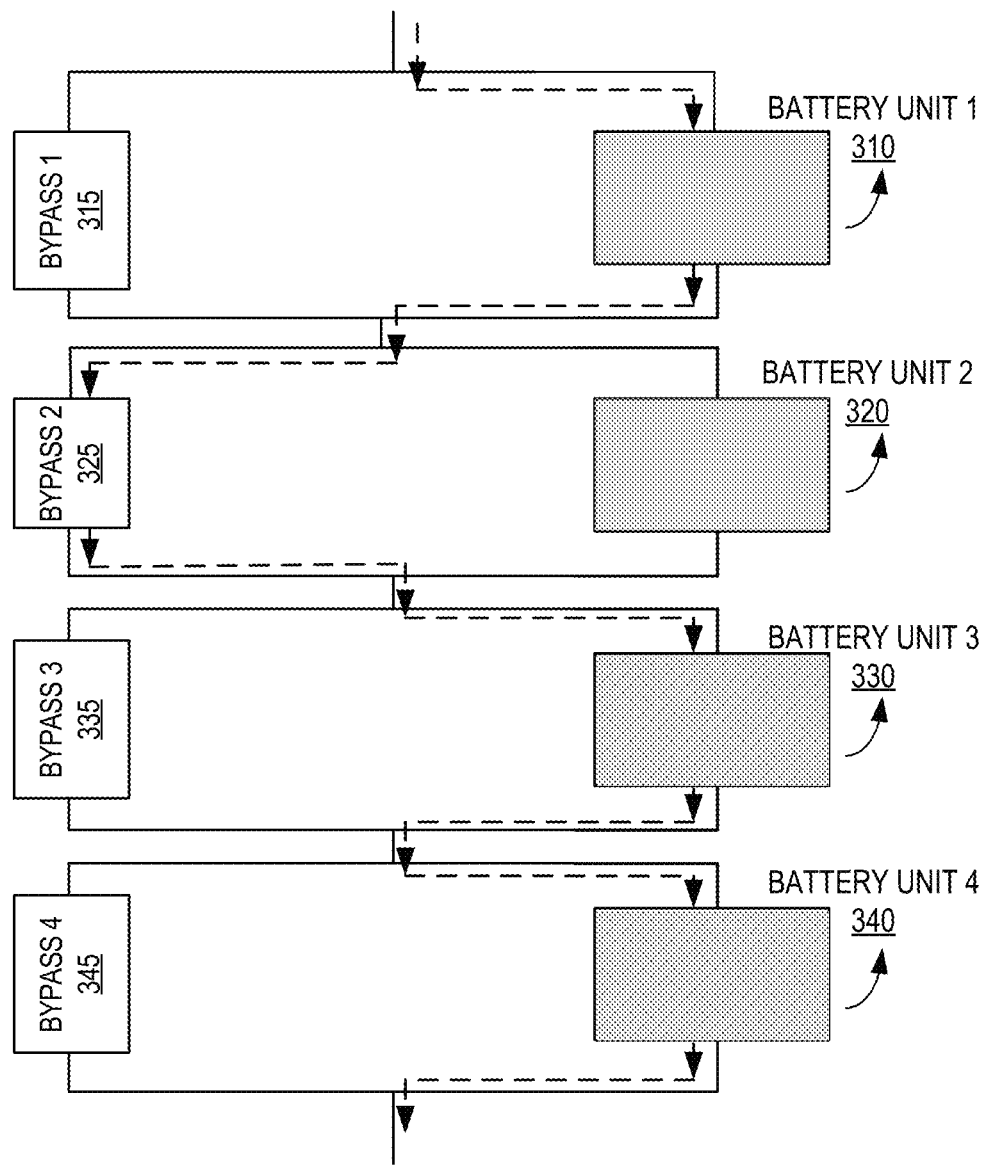
Figure 3F:
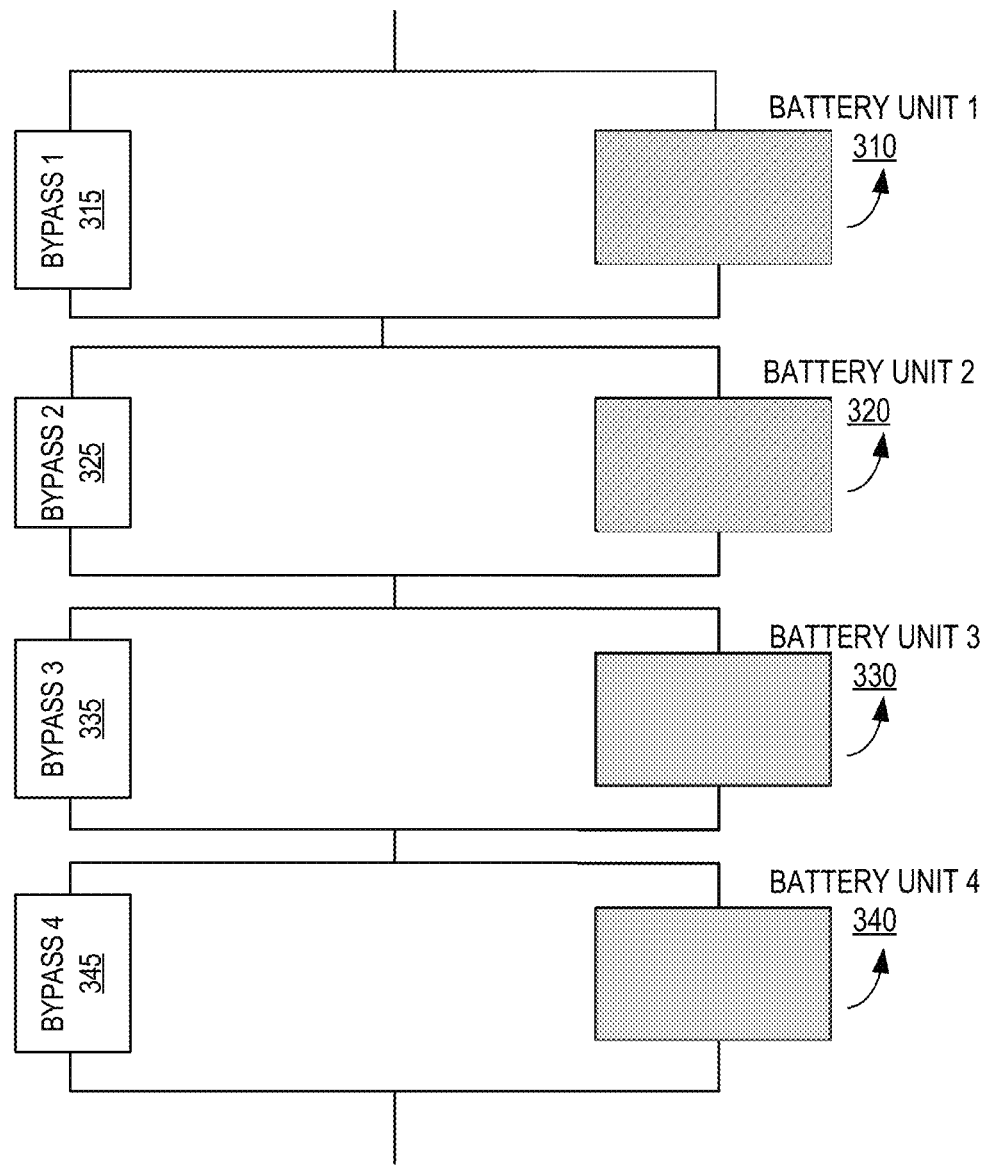

FIG. 3E illustrates subsequent charging of the battery units. As shown, the current flowing through the battery unit 1 310, the battery unit 3 330, and the battery unit 4 340 charges the battery units to substantially hundred percent of their potential. FIG. 3F illustrates the completely charged batteries and the stopping the supply of current flowing into the battery units after determining that the one or more battery units are substantially (e.g., completely) charged.

The charging of battery units illustrated in FIGS. 3A-3F is for illustrative purposes only. In another exemplary embodiment, when the current flows through each of the battery units for a time period t1, the battery unit 1 310 may be charged to seventy percent of its potential, the battery unit 2 320 may be charged to fifty percent of its potential, and the battery unit 3 330 and battery unit 4 340 may be charged to thirty percent of its potential. At this point, the bypass 1 315 may be activated and the current is supplied to the battery unit 2 320, the battery unit 3 330, and the battery unit 4 340. After a later time period t2, the battery unit 2 320 may be charged to seventy percent of its potential. In such an embodiment, the bypass 2 325 may be activated after the time period t2 and the current is supplied to the battery unit 3 330 and battery unit 4 340 until they are completely charged to seventy percent of their potential. At a later time period t3, the bypass 1 315 and the bypass 2 325 may be deactivated and the current is supplied to the battery unit 1 310, the battery unit 2 320, battery unit 3 330, and battery unit 4 340 until they are charged to hundred percent of their potential. This process of activating deactivating the bypass mechanisms may be performed by the proactive balancing system until all of the battery units reach substantially hundred percent of their potential. The proactive balancing technique implemented in the present system, via the architecture of the battery units and the bypass connections, reduces the charging time of the battery units significantly as the supply of current is continuous and there is no wastage of energy.

Similar activation and deactivation of bypass mechanism as discussed above may be applied in a scenario where the one or more battery units are discharging. In an exemplary embodiment, where the current flows from each of the one or more battery units, the battery unit 1 310 may be discharged completely, whereas the battery unit 2 320, battery unit 3 330, and battery unit 4 340 may still be at fifty percent of their potential. In such an embodiment, the bypass 1 315 may be activated allowing the battery unit 2 320, battery 3 330, and battery unit 4 340 to continue discharging until all the battery units are discharged completely.

As explained above, the proactive balancing system 210 activates and deactivates the bypass mechanisms to charge and discharge the battery units without causing any damage. The bypass mechanism and the balancing scheme employed by the proactive balancing system 210 allows the battery units to charge and discharge at a faster rate when compared with the conventional balancing schemes. Moreover, the bypass mechanism of the proactive balancing system 210 does not utilize electronically controlled switches which overcomes the noise problem presented by the other conventional methods and systems.

FIGS. 4A-4H and FIGS. 5A-5H illustrate exemplary structure and functioning of the switching protection system 220 of FIG. 2. As noted, the switching protection system 220 may be employed when connecting and disconnecting the one or more battery units 103 of the energy storage system 100 to or from a main bus.

As shown in FIGS. 4A-4H and FIGS. 5A-5H, the positive and negative terminals of the battery unit 103 are connected the positive terminal 450 and negative terminal 455 of the main bus, via the switching protection system 220. The main bus may be a Direct Current (DC) bus and the battery unit 103 may include one or more battery units connected in parallel to the DC bus.

In one embodiment, the switching protection system 220, as shown, comprises one or more elements including three switches (switch S1 430, switch S2 434, switch S3 438), four semiconductor switches (switch U1 410, switch U2 415, switch U3 420, switch U4 425), and two inductors (inductor L1 440 and inductor L2 445) taking the form of an H-bridge. In one embodiment, the semiconductor switches may be Insulated-Gate Bipolar Transistor (IGBT) switches. In some embodiments, the semiconductor switches may be Metal-Oxide-Semiconductor Field-Effect Transistors (MOSFET's). In some embodiments, each of the semiconductor switches may further comprise a body diode connected in parallel to the semiconductor switches. The switching protection system 220 may further comprise a controller to operate the one or more elements of the H-bridge, a first set of sensors to measure the voltages of the one or more battery units and the main bus and a second set of sensors to measure the currents flowing through the one or more battery units, the main bus, and the system. The switches shown in FIGS. 4A-4H and FIGS. 5A-5H are for illustrative purposes only. Other types of soft switches that allow for high speed switching may be used.

In one embodiment, the H-bridge may comprise four electrical paths as shown in FIGS. 4A-4H and FIGS. 5A-5H. A first electrical path connected between the positive terminal 450 of the main bus and the positive terminal of the one or more battery units 103 comprising the switch S1 430. A second electrical path connected between the negative terminal 455 of the main bus and the one or more battery units 103 comprising the switch S3 438. A third electrical path connected in parallel to the first electrical path between the positive terminal 450 of the main bus and the one or more battery units 103 comprising the semiconductor switch U1 410, semiconductor switch U2 415, switch S2 434, the inductor L1 440, and the inductor L2 445. A fourth electrical path connected in parallel to the second electrical path between the negative terminal 455 of the main bus and the one or more battery units 103 comprising semiconductor switch U3 420, semiconductor switch U4 425, switch S2 434, the inductor L1 440, and the inductor L2 445.

FIGS. 4A-4H illustrate the switching mechanism employed by the controller of the switching protection system 220 of FIG. 2 for connecting the one or more battery units 103 of the energy storage system 100 to a main bus, in accordance with an embodiment of the present invention.

In some embodiments, the one or more battery units 103 and the main bus may have different voltages potentials. For example, in some embodiments, the voltage $V_B$ of the one or more battery units 103 may be less than the voltage $V_{MB}$ of the main bus. In such an embodiment, the controller of the switching protection system 220 controls the one or more elements as shown in FIGS. 4A-4E to connect the one or more battery units to the main bus. In some other embodiments, the voltage $V_B$ of the one or more battery units 103 may be greater than the voltage $V_{MB}$ of the main bus. In such an embodiment, the controller of the switching protection system 220 controls the one or more elements as shown in FIG. 4A, FIG. 4B, and FIG. 4F-4G to connect the one or more battery units to the main bus. The switching protection system 220 typically equalizes the voltage difference between the one or more battery units and the main bus by controlling the switches in a specific manner before directly connecting the one or more battery units 103 to the main bus. If the positive and negative terminals of the one or more battery units 103 are connected directly to the positive terminal 450 and the negative terminal 455 of the main bus without eliminating any voltage difference between them, a sudden inrush of current can be drawn by either the one or more battery units 103 or the main bus based on the direction of the current. For example, if the voltage of the main bus is greater than the one or more battery units, a sudden inrush current flows from the main bus to the one or more battery units. This inrush current can cause significant damage to the one or more battery units 103, the main bus, and the system connected to the main bus. As such, the sudden flow of inrush current is not desired. In order to overcome this problem, the controller of the switching protection system 220 employs a switching mechanism to overcome the effects of the inrush current. Additionally, the inductors in the switching protection system 220 contribute to overcoming the effects of the inrush current. The inductor L1 440 and the inductor L2 445 limit this inrush current by building up the voltage using the inrush current. Additionally, the voltage developed across the inductor L1 440 and the inductor L2 445 helps to equalize the voltage difference between the one or more battery units 103 and the main bus.

Figure 4A:
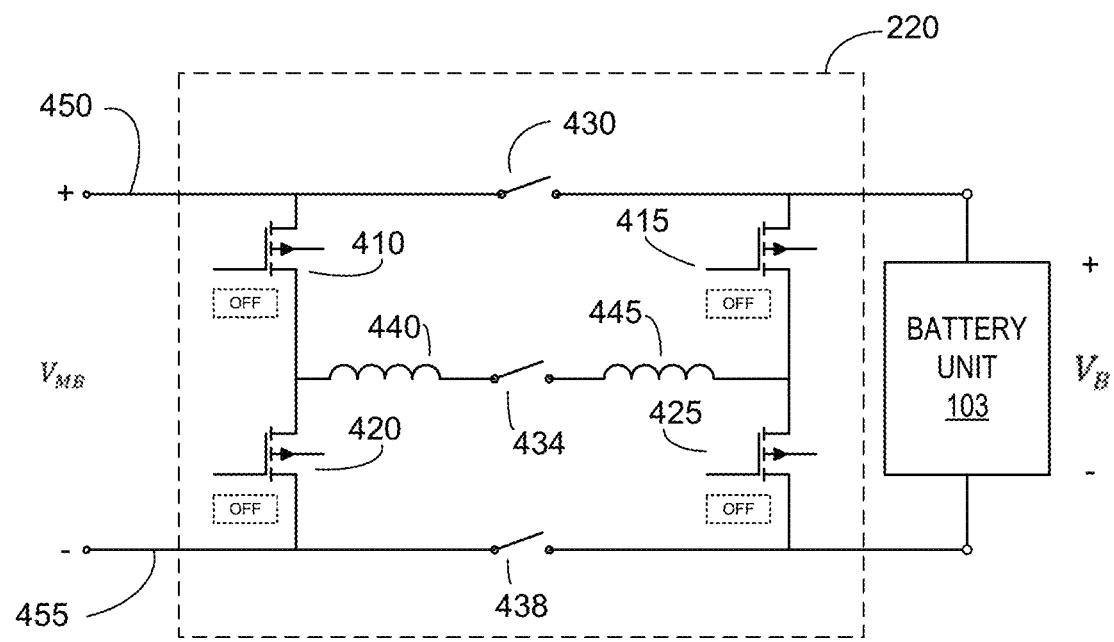
FIGS. 4A-4H illustrate exemplary structure and functioning of a switching protection system of FIG. 2 for connecting one or more battery units of an energy storage system to a main bus, in accordance with an embodiment of the present invention.

FIG. 4A illustrates the one or more battery units 103 disconnected from the main bus. As shown, the switch S1 430, the switch S2 434, and the switch S3 438 are open and the switch U1 410, the switch U2 415, the switch U3 420, and the switch U4 425 are in an OFF state, thereby disconnecting the one or more battery units from the main bus.

Figure 4B:
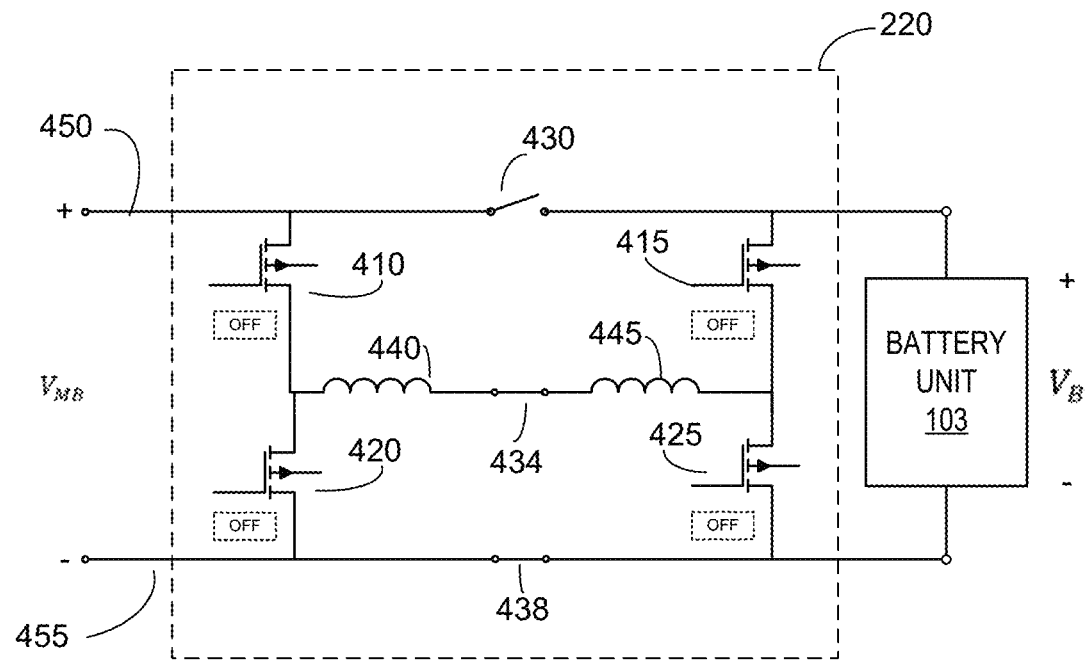

FIG. 4B illustrates a first step in the process of connecting the one or more battery units 103 to the main bus for both the embodiments, where the voltage $V_B$ of the one or more battery units 103 is greater than the voltage $V_{MB}$ of the main bus and the voltage $V_B$ of the one or more battery units 103 is less than the voltage $V_{MB}$ of the main bus. The controller of the switching protection system 220 closes the switch S2 434 and the switch S3 438. When the switch S2 434 and switch S3 438 are closed, no current flows between the one or more battery units 103 and the main bus, as the semiconductor switches are initially in an OFF state.

Figure 4C:
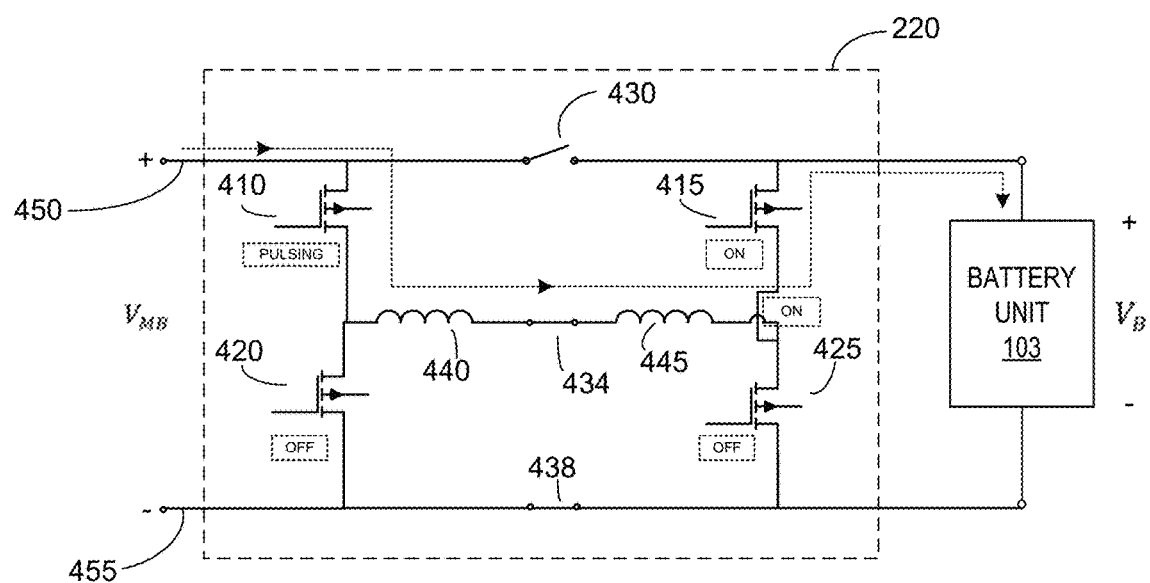

FIG. 4C illustrates a second step specific to the embodiment in which, the voltage $V_B$ of the one or more battery units 103 is less than the voltage $V_{MB}$ of the main bus. The controller of the switching protection system 220 pulses the semiconductor switch U1 410 at a certain frequency and turns ON semiconductor switch U2 415. In other words, the controller changes the semiconductor switch U1 410 from a previously OFF state as illustrated in FIG. 4B to a SWITCHING or PULSING state as illustrated in FIG. 4C. In one embodiment, the switch U2 415 is not turned ON, but the current flows through the switch U2 415 via a body diode (not shown) associated with the switch U2 415, as the body diode may be connected in parallel to the switch U2 415 and may be reverse biased with respect to the positive terminal 450 of the main bus. The body diode parallel to switch U2 415 conducts and allows the current flowing from switch U1 410 to flow to the one or more battery units.

The switching frequency of the semiconductor switch U1 410 may be determined by the controller based on one or more parameters including, but not limited to, the voltage $V_B$ of the one or more battery units 103, the voltage $V_{MB}$ of the main bus, and a flow of current between the one or more battery units 103 and the main bus. The impedance and the voltage of the inductor L1 440 and the inductor L2 445 is dependent on the frequency of switching of semiconductor switch U1 410. The switching frequency of the semiconductor switch U1 410 is controlled by the controller so as to control the impedance of the inductors to thereby limit the inrush current and also to develop a voltage across the inductors, where the voltage may help to equalize the voltage difference between the one or more battery units 103 and the main bus. As shown in FIG. 4C, upon PULSING semiconductor switch U1 410 and turning ON semiconductor switch U2 415, the current flows from the main bus to the one or more battery units 103 via the semiconductor switch U1 410, the inductor L1 440, the semiconductor switch S2 434, the inductor L2 445, and the semiconductor switch U2 415. Initially, the impedance developed on the inductor L1 440 and the inductor L2 445 is high as a result of the switching frequency, thereby limiting the flow of inrush current. However, the switching frequency is thereafter controlled to reduce the impedance of the inductors, thereby permitting more current to flow. The impedance developed across the inductors allows for gradual increase in the supply of current to the one or more battery units 103. The current flowing to the one or more battery units 103 charges the one or more battery units and raises the voltage of the one or more battery units 103.

Figure 4D:
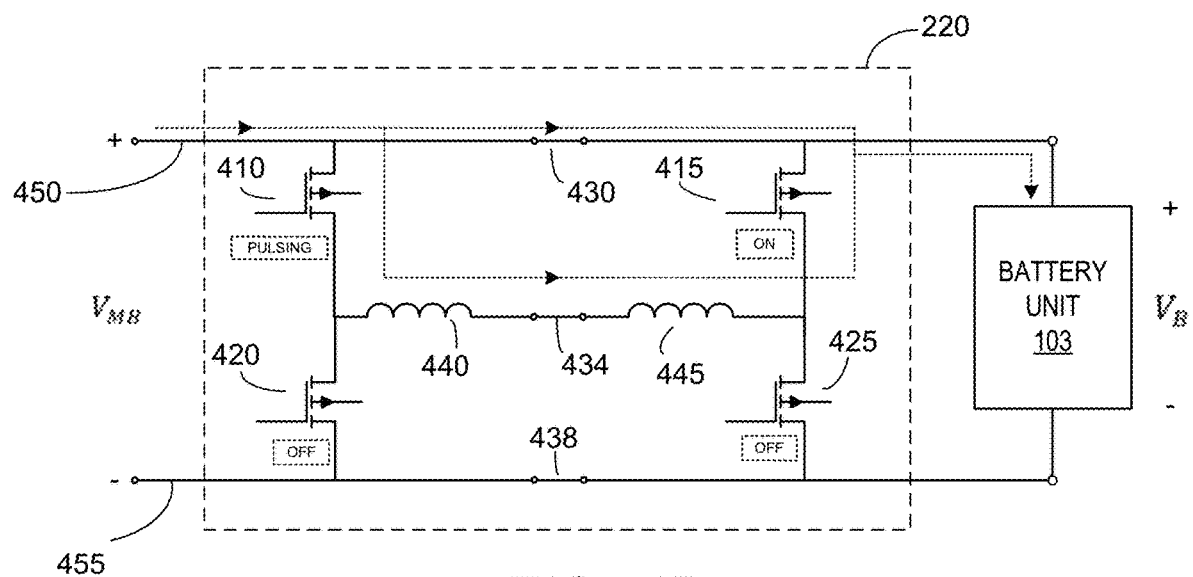

FIG. 4D illustrates a third step specific to the embodiment, where the voltage $V_B$ of the one or more battery units 103 is less than the voltage $V_{MB}$ of the main bus. When the voltage difference between the one or more battery units 103 and the main bus is sufficiently small (e.g., less than a predetermined value), the controller of the switching protection system 220 closes the switch S1 430 allowing the current to flow directly between the main bus and the one or more battery units 103. At this point, the current also flows through the semiconductor switch U1 410, the inductor L1 440, the switch S2 434, the inductor L2 445, and the semiconductor switch U2 415 as shown in FIG. 4D.

Figure 4E:
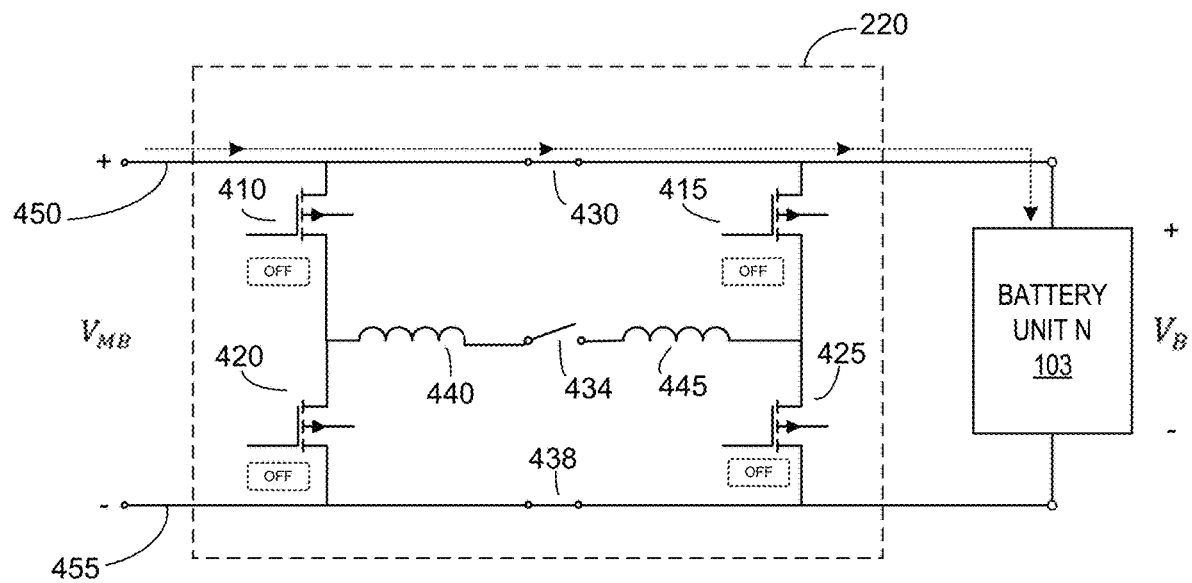

FIG. 4E illustrates a fourth step specific to the embodiment, where the voltage $V_B$ of the one or more battery units 103 is less than the voltage $V_{MB}$ of the main bus. When the potential difference between the main bus and the one or more battery units 103 is almost equal, the controller of the switching protection system 220 opens the switch S2 434 and turns OFF the semiconductor switch U1 410 and semiconductor switch U2 415 allowing the current to flow directly from the main bus to the one or more battery units. This switching mechanism employed by the controller of the switching protection system 220 facilitates the connection of the one or more battery units 103 to the main bus safely without causing any damage to the one or more battery units 103 by gradually increasing the flow of current to the one or more battery units 103, via the pulsing of the semiconductor switch U1 410. The controller may receive input data associated with voltages of the one or more elements, the main bus, and the one or more battery units 103 from the one or more sensors of the switching protection system 220 and may use the inputs to calculate the voltage difference between the main bus and the one or more battery units 103 in order to determine the timing associated with opening and closing of switches in the switching protection system 220.

Figure 4F:
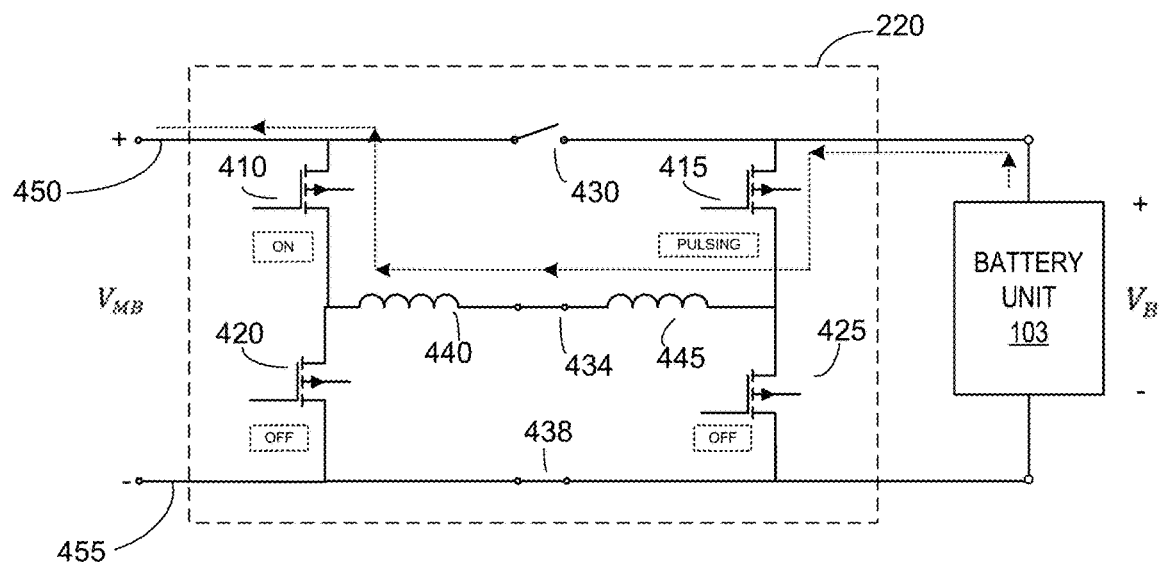

FIG. 4F illustrates a second step specific to the embodiment, where the voltage $V_B$ of the one or more battery units 103 is greater than the voltage $V_{MB}$ of the main bus. The controller of the switching protection system 220 switches ON and OFF the semiconductor switch U2 415 at a certain frequency and turns ON semiconductor switch U1 410. In one embodiment, the semiconductor switch U1 410 is not turned ON, but the current flows through the semiconductor switch U1 410 via the body diode (not shown) associated with the semiconductor switch U1 410, as the body diode connected in parallel to the switch U1 410 is reverse biased with respect to the positive terminal 450 of the main bus. The body diode of switch U1 410 conducts and allows the current flowing from switch U2 415 to flow to the positive terminal 450 of the main bus.

As explained above, the switching frequency of the semiconductor switch U2 415 may be determined by the controller based on one or more parameters including, but not limited to, the voltage $V_B$ of the one or more battery units 103, the voltage $V_{MB}$ of the main bus, and a flow of current between the one or more battery units 103 and the main bus. The impedance and the voltage of the inductor L1 440 and the inductor L2 445 is dependent on the frequency of switching of semiconductor switch U2 415. The switching frequency of the semiconductor switch U2 415 is controlled by the controller so as to control the impedance of the inductors to thereby limit the inrush current and also to develop a voltage across the inductors, where the voltage helps to equalize the voltage difference between the one or more battery units 103 and the main bus. As shown in FIG. 4F, upon PULSING semiconductor switch U2 415 and turning semiconductor switch U1 410 ON, the current flows from the one or more battery units 103 to the main bus via the semiconductor switch U2 415, the inductor L2 445, the semiconductor switch S2 434, the inductor L1 440, and the semiconductor switch U1 410. As mentioned above, the inductor L1 440 and the inductor L2 445 limit the inrush current via the voltage and impedance developed on the inductors. In this regard, initially, the impedance developed on the inductor L1 440 and the inductor L2 445 is high as a result of the switching frequency, thereby limiting the flow of inrush current. However, the switching frequency is thereafter controlled to reduce the impedance of the inductors, thereby permitting more current to flow.

Figure 4G:
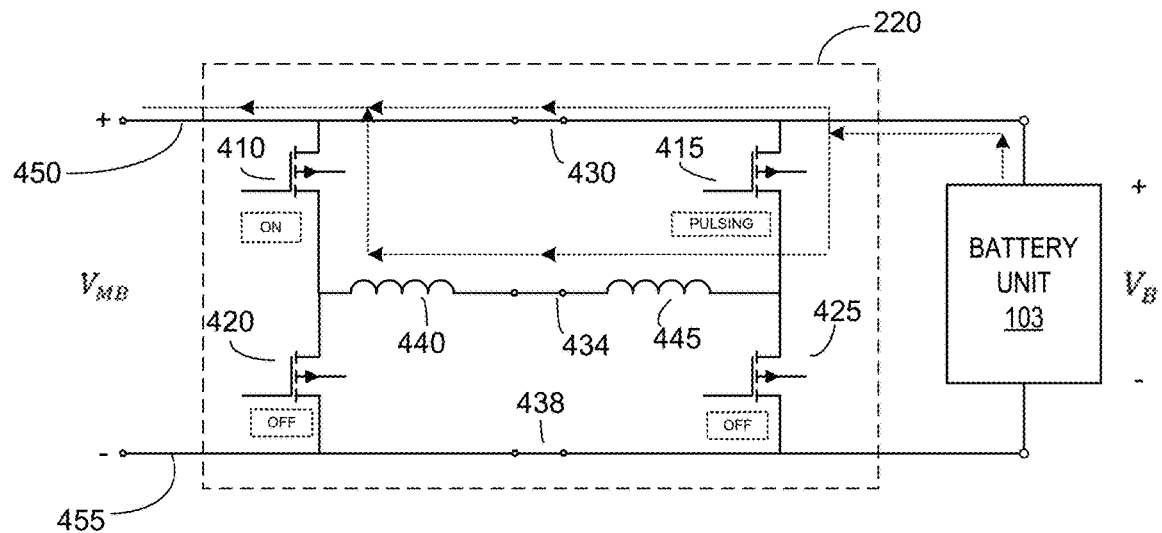

FIG. 4G illustrates a third step specific to the embodiment, where the voltage $V_B$ of the one or more battery units 103 is greater than the voltage $V_{MB}$ of the main bus. When the voltage difference between the one or more battery units 103 and the main bus is sufficiently small or less than a predetermined value, the controller of the switching protection system 220 closes the switch S1 430 allowing the current to flow directly from the one or more battery units 103 to the main bus. At this point, the current also flows through the semiconductor switch U2 415, the inductor L2 445, the switch S2 434, the inductor L1 440, and the semiconductor switch U1 410 as shown in FIG. 4D. The current flowing from the one or more battery units 103 to the main bus is the current which is discharged by the one or more battery units 103, where the controller drains the one or more battery units 103.

Figure 4H:
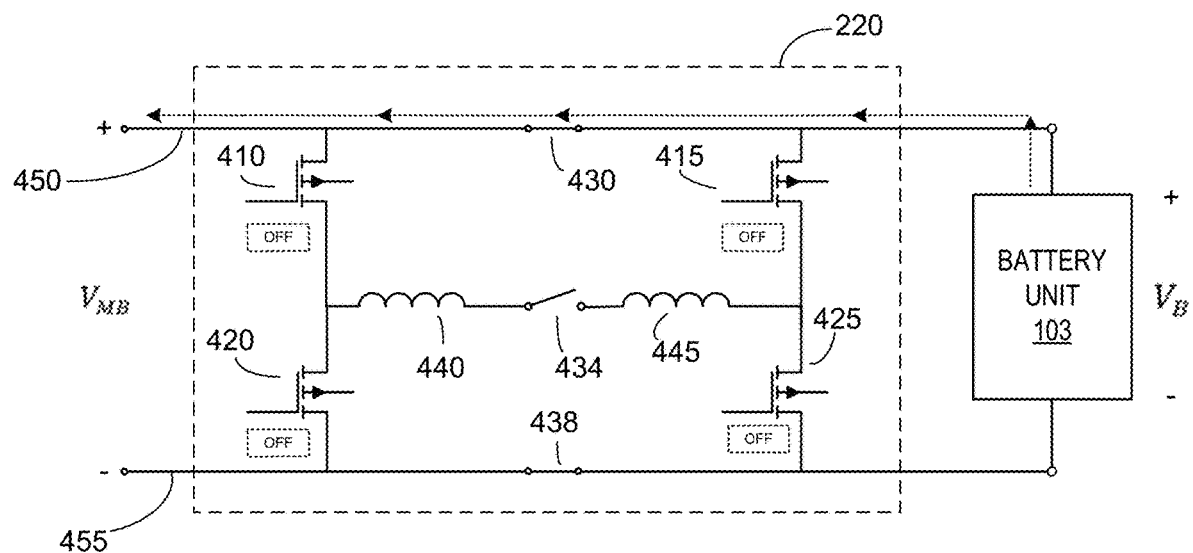

FIG. 4H illustrates a fourth step specific to the embodiment, where the voltage $V_B$ of the one or more battery units 103 is greater than the voltage $V_{MB}$ of the main bus. When the potential difference between the one or more battery units 103 and the main bus is almost equal, the controller of the switching protection system 220 opens the switch S2 434 and turns OFF the semiconductor switch U1 410 and semiconductor switch U2 415 allowing the current to flow directly from the one or more battery units 103 to the main bus. This switching mechanism employed by the controller of the switching protection system 220 facilitates the connection of the one or more battery units 103 to the main bus safely without damaging the systems connected to the main bus. The controller may receive input data associated with voltages of the one or more elements, the main bus, and the one or more battery units 103 from the one or more sensors of the switching protection system 220 and may use the inputs to calculate the voltage difference between the main bus and the one or more battery units 103 in order to determine the timing associated with opening and closing of switches in the switching protection system 220. In some embodiments, the one or more controllers employed by the switching protection system 220 and the proactive balancing system 210 are the same.

The switching protection system 220 may use inexpensive switches as shown in FIG. 4A-4H to control the flow of current between the main bus and the one or more battery units while connecting the main bus and the one or more battery units. The switching protection system gradually increases the current flow by varying the switching frequency of the switches in order to prevent the initial inrush current from causing any damage to the main bus and the one or more battery units without using any additional expensive protection equipment.

FIGS. 5A-5H illustrate the process employed by the switching protection system 220 of FIG. 2 for disconnecting the one or more battery units 103 of the energy storage system 100 from the main bus, in accordance with an embodiment of the present invention. In some embodiments, the one or more battery units 103 are connected, via the main bus, to a source (e.g., power generation station), where the one or more battery units 103 are charged when connected to the source. In such an embodiment, current flows from the main bus to the one or more battery units. In other embodiments, the one or more battery units 103 are connected, via the main bus, to a load, where the one or more battery units are discharged to supply power to the load. In such an embodiment, the current flows from the one or more battery units 103 to the main bus. The sudden disconnection of the one or more battery units 103 and the main bus by opening a switch may cause the current to flow between the terminals of a switch with air as the conducting medium. As such, arcing or arc flashover may occur, which is undesirable, as it can have detrimental effects on the one or more battery units 103, the main, and all other systems connected to the main bus. In some cases, the arc flashover may cause low impedance ground faults. As such, conventional systems use special equipment that mitigate the effect of arc flashover and/or to prevent the arc flashover. However, such equipment for high voltages is very expensive. The switching mechanism employed by the switching protection system 220 to disconnect the one or more battery units 103 and the main bus is described in details below.

Figure 5A:
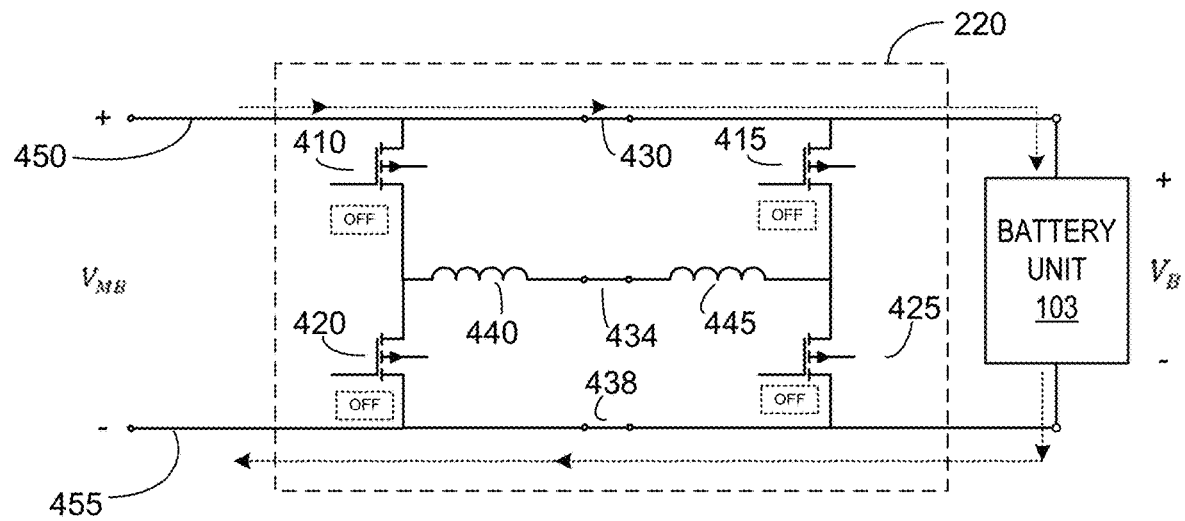
FIGS. 5A-5H illustrate exemplary structure and functioning of the switching protection system of FIG. 2 for disconnecting the one or more battery units of the energy storage system from the main bus, in accordance with an embodiment of the present invention.

FIG. 5A illustrates the one or more battery units 103 connected to the main bus, where the main bus is connected to a source system. As shown, the current flows from the main bus via the one or more battery units 103, via switch S1 430 and switch S3 438. The current flowing from the main bus charges the one or more battery units 103 by building up the voltage. The semiconductor switch U1 410, the semiconductor switch U2 415, semiconductor switch U3 420, and semiconductor switch U4 425 are initially in OFF state. As such, no current flows via the inductor L1 440, the switch S2 434, and the inductor L2 445. In another embodiment, where the main bus is connected to a load system, the current flows from the one or more battery units 103 to the main bus and the load system, via the switch S1 430 and the switch S3 438. In such an embodiment, the current flowing is the current discharged from the one or more battery units 103.

Figure 5B:
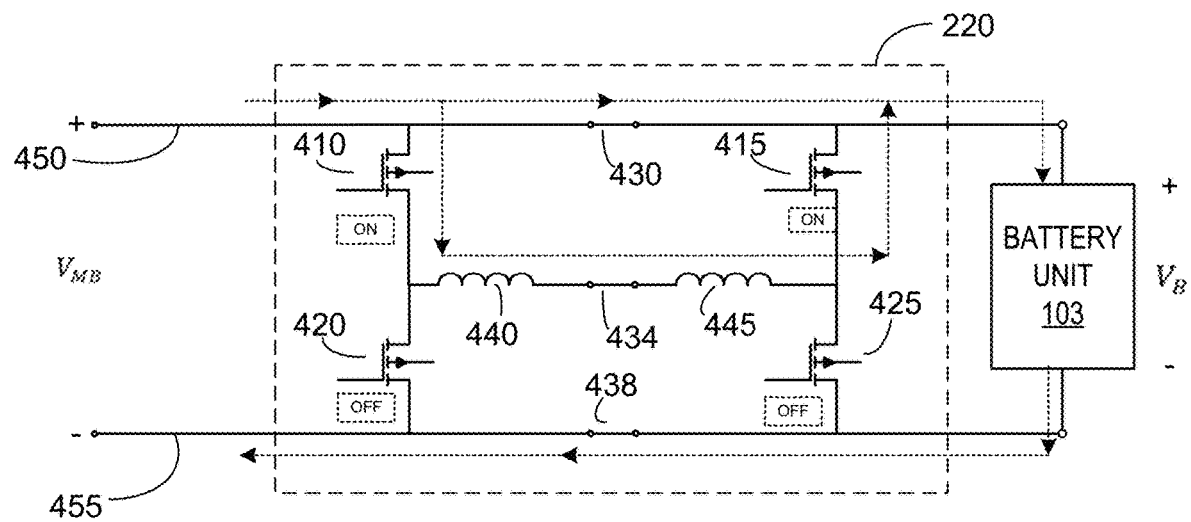

FIG. 5B illustrates a first step implemented by the switching protection system 220 for disconnecting the one or more battery units 103 from the main bus. The controller of the switching protection system 220 turns ON the semiconductor switch U1 410 and the semiconductor switch U2 415 and the current starts flowing through the switch S1 430 and the switch S2 434. Accordingly, the current flows through a first path and a second path. The first path includes the current flowing between the positive terminal 450 and the one or more battery units 103, via the switch S1 430. The second path includes the current flowing between the positive terminal 450 and the one or more battery units 103, via the inductor L1 440, the switch S2 434, and the inductor L2 445.

Figure 5C:
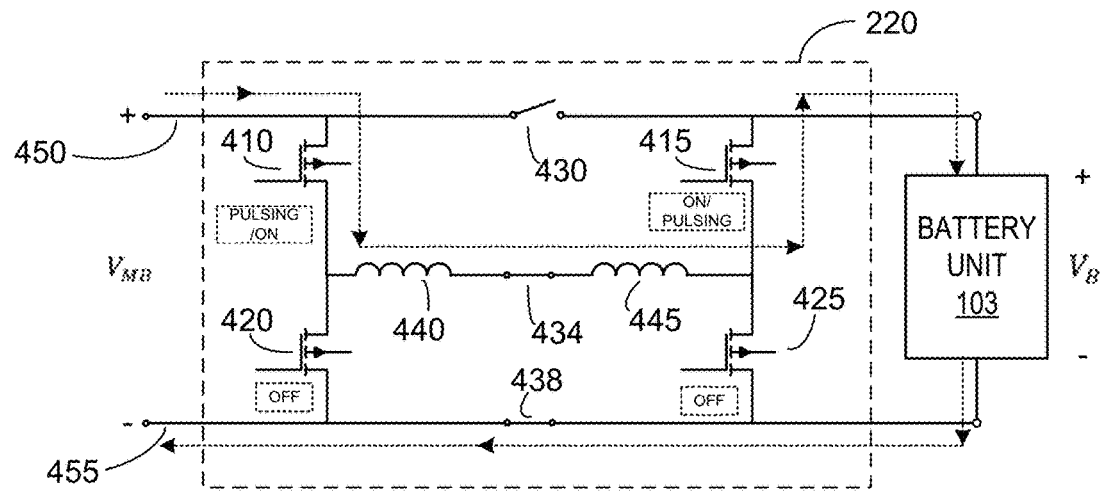

FIG. 5C illustrates a second step implemented by the switching protection system 220 for disconnecting the one or more battery units 103 from the main bus. The controller of the switching protection system 220 opens the switch S1 430 and controls the switching frequency of either the semiconductor switch U1 410 or the semiconductor switch U2 415 depending on whether the one or more battery units 103 are being charged or discharged. In the embodiment, where the one or more battery units 103 are being charged and the current is flowing from the main bus to the one or more battery units 103, the controller controllably pulses the semiconductor switch U1 410 to allow the inductors to develop an impedance slowly, thereby gradually decreasing the amount of current flowing to the one or more battery units 103. The controller keeps the semiconductor switch U2 415 turned ON. The current may flow through the body diode associated with the semiconductor switch U2 415 irrespective of whether the controller turns ON the semiconductor switch U2 415 or not, as the body diode associated with the semiconductor switch U2 420 is reverse biased with respect to the positive terminal 450 of the main bus. The frequency of switching creates the impedance across both the inductors, which in turn resists the flow of current through the inductors. In the embodiment, where the one or more battery units 103 are being discharged and the current is flowing from the one or more battery units 103 to the main bus, the controller controllably pulses the semiconductor switch U2 415 to allow inductors to develop an impedance slowly, thereby gradually decreasing the amount of current flowing from the one or more battery units 103. The controller keeps the semiconductor switch U1 410 turned ON. The current may flow through the body diode associated with the semiconductor switch U1 410 irrespective of whether the controller turns ON the semiconductor switch U1 410, as the body diode associated with the semiconductor switch U1 410 is reverse biased with respect to the positive terminal 450 of the main bus.

Figure 5D:
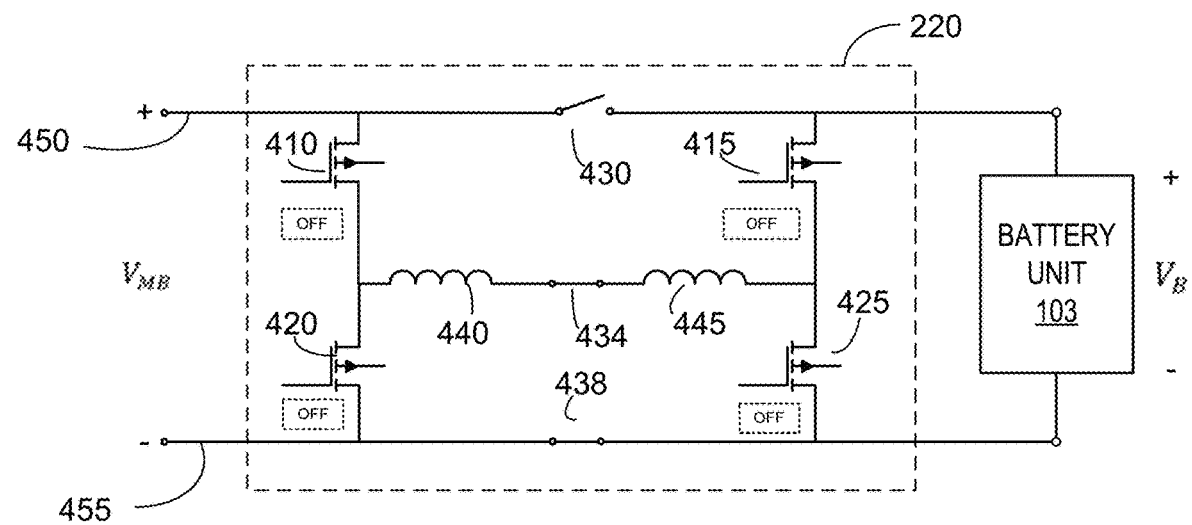

FIG. 5D illustrates a third step implemented by the switching protection system 220 for disconnecting the one or more battery units 103 from the main bus. The controller of the switching protection system 220 turns OFF the semiconductor switch U1 410 and the semiconductor switch U2 415 and no current flows between the one or more battery units 103 and the main bus, via the switch S1 430 and switch S3 438. At this stage, the voltage developed across the inductor L1 440 and the inductor L2 445 is equal to the voltage difference between the main bus and the one or more battery units 103.

In some embodiments, a low impedance ground fault may occur and may cause the current to flow in the negative rail of the system via the switch S3 438. In order to overcome the effects of the ground fault, the controller of the switching protection system 220 implements the steps as discussed in FIG. 5E-5H below. In some embodiments, the system may implement the steps discussed in FIG. 5E-5H in response to detecting the ground fault. In such an embodiment, the controller opens switch S3 430 directly without performing any of the steps described below. In some embodiments, the system may implement the steps discussed in FIG. 5E-5H irrespective of whether the ground fault has occurred.

Figure 5E:
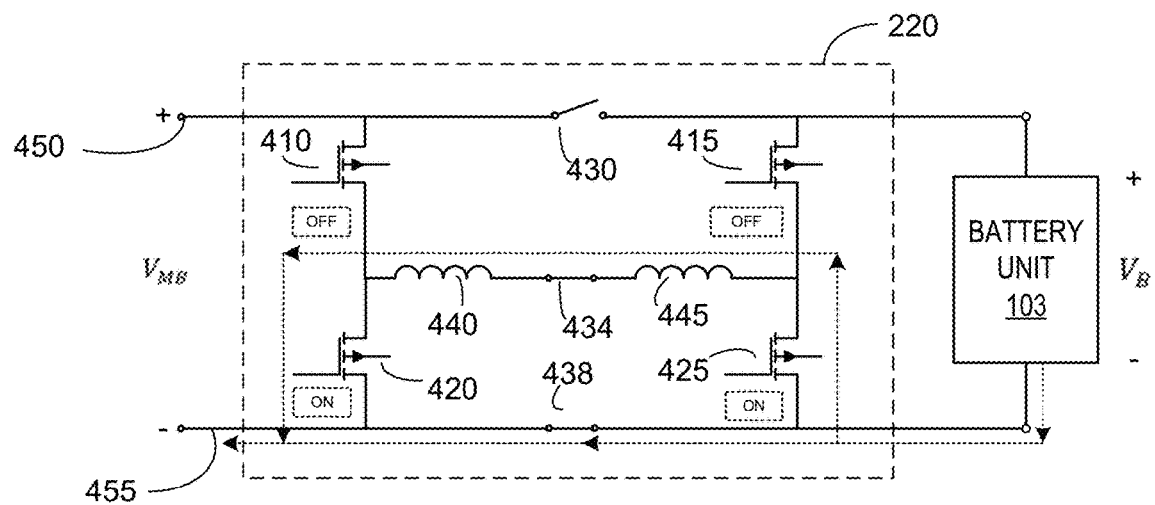

FIG. 5E illustrates a fourth step implemented by the switching protection system 220 for disconnecting the one or more battery units 103 from the main bus. The controller of the switching protection system 220 turns ON the semiconductor switch U3 420 and the semiconductor switch U4 425. At this point, voltage across the inductor L1 440 and the inductor L2 445 is zero.

Figure 5F:
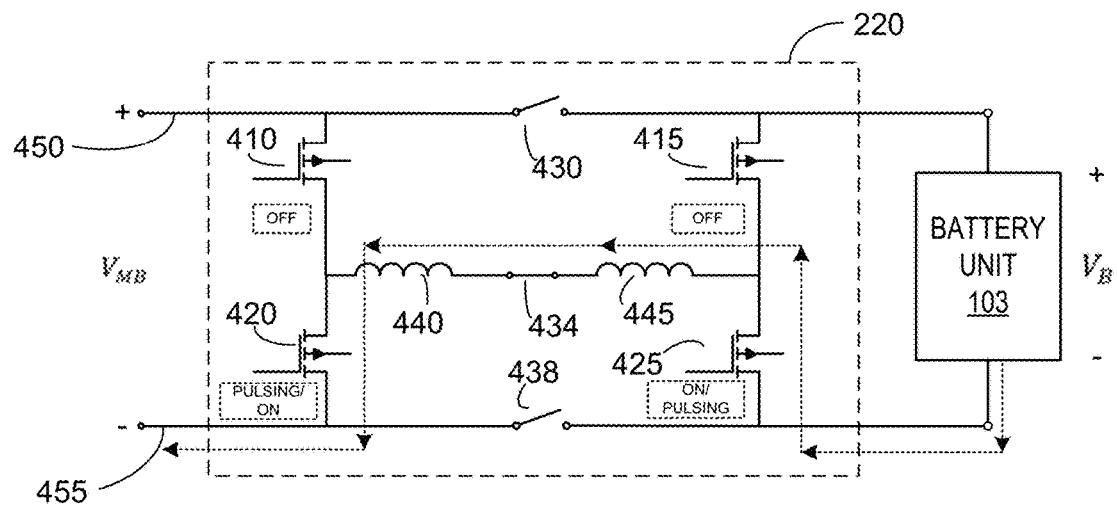

FIG. 5F illustrates a fifth step implemented by the switching protection system 220 for disconnecting the one or more battery units 103 from the main bus. The controller of the switching protection system 220 opens the switch S3 438 and controllably pulses the semiconductor switch U3 420 or the semiconductor switch U4 425 depending on whether the one or more battery units 103 were previously charging or discharging. In the embodiment, where the one or more battery units 103 are being charged and the current is flowing from the main bus to the one or more battery units 103, the controller controllably pulses the semiconductor switch U3 420 and keeps the semiconductor switch U4 425 ON, thereby gradually decreasing the amount of current flowing to the one or more battery units 103 (e.g., by controlling a switching frequency to increase an impedance of the inductors). In the embodiment, where the one or more battery units 103 are being discharged and the current is flowing from the one or more battery units 103 to the main bus, the controller controllably pulses the semiconductor switch U4 425 and keeps the semiconductor switch U3 420 ON, thereby gradually decreasing the amount of current flowing from the one or more battery units 103 (e.g., by controlling a switching frequency to increase an impedance of the inductors).

Figure 5G:
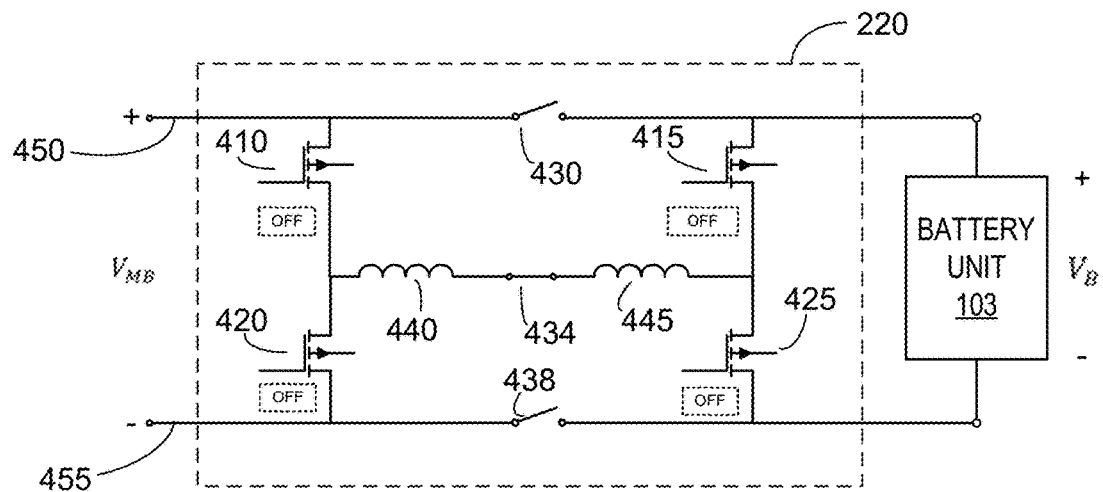
Figure 5H:
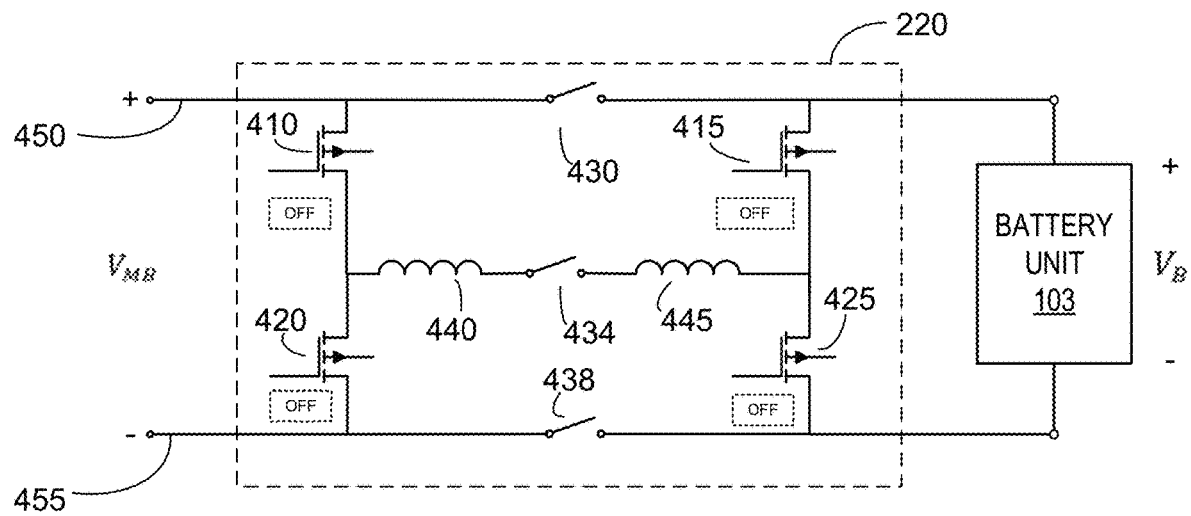

FIG. 5G illustrates a sixth step implemented by the switching protection system 220 for disconnecting the one or more battery units 103 from the main bus. The controller of the switching protection system 220 turns OFF the semiconductor switch U3 420 and the semiconductor switch U4 425 and no current flows between the one or more battery units 103 and the main bus. At this point, the voltage across the inductors is the voltage difference between the one or more battery units 103 and the main bus. As shown in FIG. 5E, the controller turns the semiconductor switch U3 420 and the semiconductor switch U4 425 ON initially and gradually transitions them to fully OFF as shown in FIGS. 5F-5G, thereby gradually reducing the current flowing through the switch S3 438 to zero. This prevents any occurrence of arcing or arc flashover when the switch S3 438 is opened. FIG. 5H illustrates a seventh step implemented by the switching protection system 220 for disconnecting the one or more battery units 103 from the main bus. The controller of the switching protection system 220 may open the switch S2 434, thereby disconnecting the one or more battery units 103 and the main bus to provide full galvanic isolation. In some embodiments, the controller of the switching protection system 220 does not open the switch S2 434.

The switching protection system 220 may use inexpensive switches as shown in FIGS. 5A-5H to control the flow of current between the main bus and the one or more battery units while disconnecting the main bus and the one or more battery units. The switching protection system gradually decreases the current flow by varying the switching frequency of the switches in order to control the impedance of the inductors and thereby prevent the arc flashover without using any additional expensive protection equipment such as load break switches.

Figure 6A:
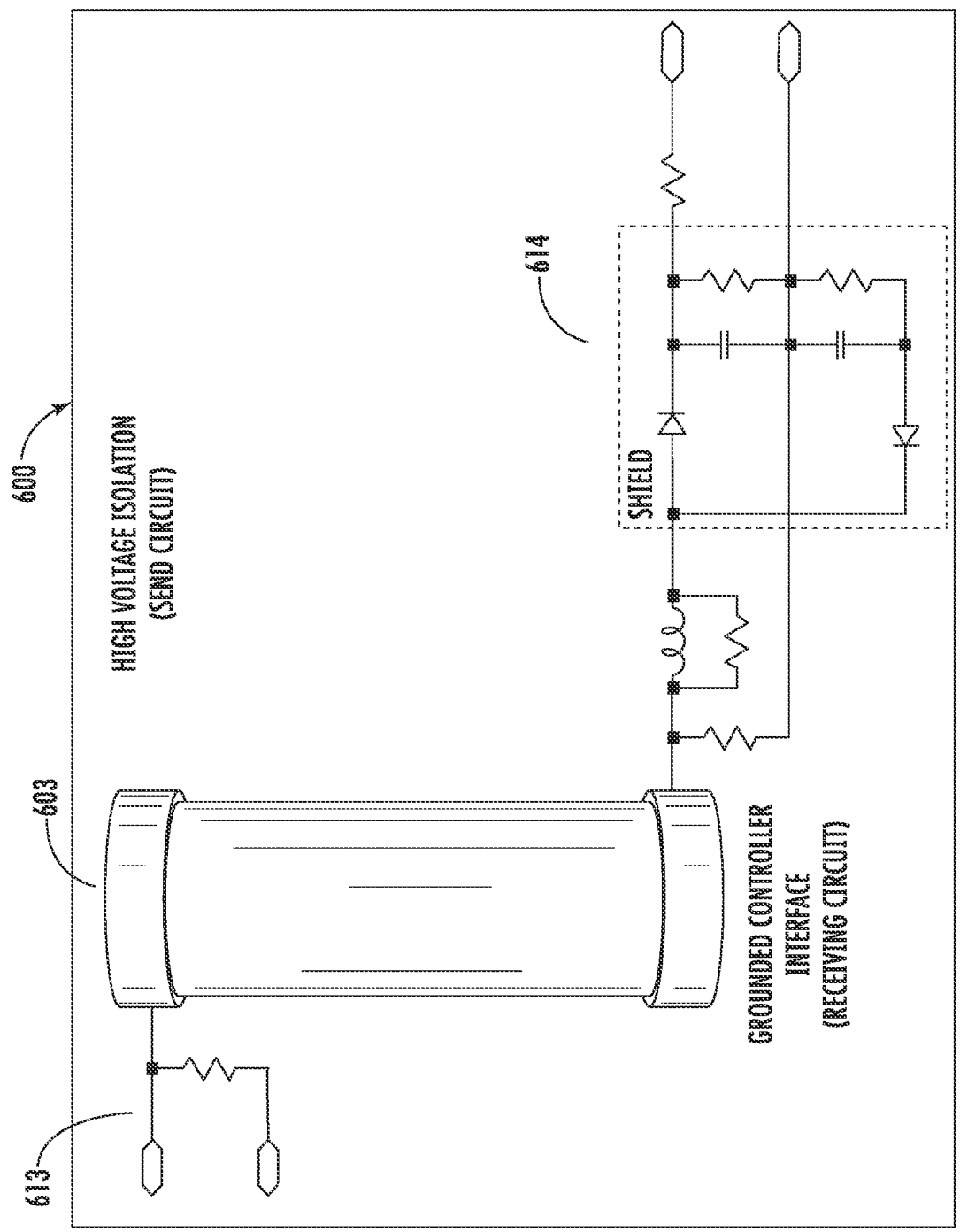
FIGS. 6A-6B illustrate an isolated communication circuit employed by an isolated communication system of FIG. 2, in accordance with an embodiment of the present invention.
Figure 6B:
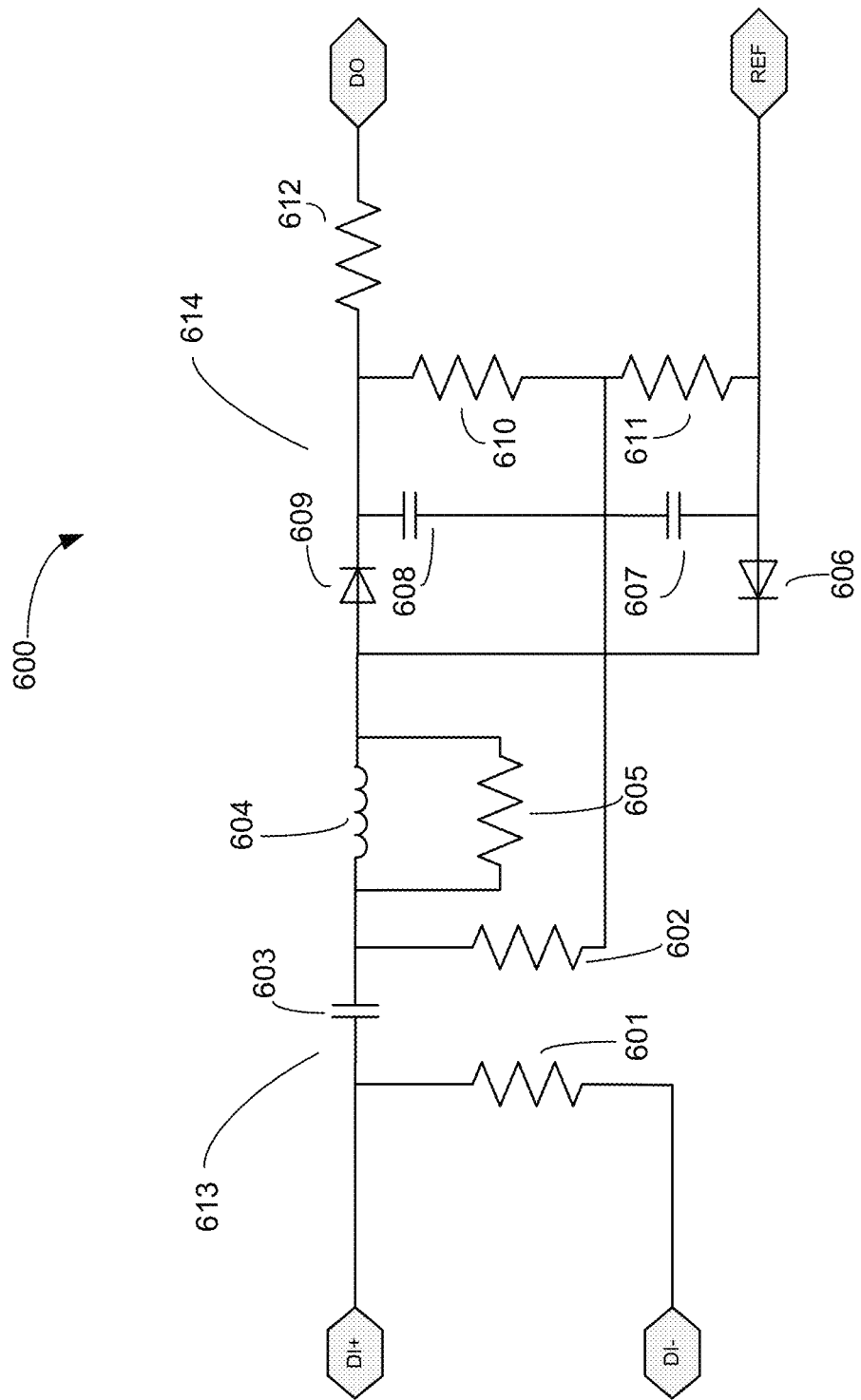

FIGS. 6A-6B illustrate an isolated communication circuit 600 employed by the isolated communication system 230 of FIG. 2, in accordance with an embodiment of the present invention. Typically, the one or more controllers (e.g., a centralized controller) control the one or more battery units by transmitting communication or data signals to a controller which is internal to each of the one or more battery units to perform one or more functions described herein. The high voltage nature of the energy storage system may cause interference while transmitting these communication signals. The isolated communication system 230 provides a cost effective solution to transmit the communication signals without any interference by using existing insulation and/or capacitors in the energy storage system. As shown, the isolated communication system comprises a transmitter circuit 613 and a receiver circuit 614. The transmitter circuit 613 comprises a capacitor C1 603 which acts as a coupling capacitor for transmitting communication signals. The capacitor C1 603 may be a part of the existing insulation of the energy storage system. Alternatively, the capacitor C1 603 may be a coupling capacitor that is not part of the insulation. The isolated communication system utilizes the capacitor C1 to transmit the communication signals. The transmitter circuit 613 further comprises an inductor L1 604 for tuning the communication signal (e.g., to a certain frequency) for allowing the communication signals to pass through the existing insulation to which the isolated communication system 230 is connected to. As shown, the transmitter circuit 613 further comprises a resistor R1 601, a resistor R2 602, and a resistor R3 605. The resistor R1 601, the resistor R2 602, and the resistor R3 605 stabilize the communication of the transmitter circuit 613 and also damp any oscillations in the circuit.

As shown, the receiving circuit 614 comprises a diode D1 609, a resistor R4 610, a capacitor C2 608, a capacitor C3 607, a diode D2 606, and a resistor R5 611. The elements of the receiving circuit 614 functions as a filter to reduce noise levels in the communication signals between different battery units and controllers of the energy storage system. The receiving circuit 614 also functions as a drain return path to the capacitor C1 603, thereby preventing the capacitor C1 to charge completely. The resistor R6 612 prevents excessive flow of current into the receiving circuit 614. Additional digital filters may be present in the transmitter circuit 613 and the receiving circuit 614 to filter out any noise that may be introduced into the communication signal.

Typically, each of the one or more battery units in the energy storage system is connected to an isolated communication circuit that is positioned between such battery unit and other battery units, controllers, and other devices of the energy storage system. The isolated communication circuit is connected to an internal controller of each of the one or more battery units, thereby allowing the internal controllers to communicate with each other and also with one or more central controllers of the energy storage system. The transmitter circuit 613 acts an antenna and transmits the communication signals received from an internal controller of a battery unit wirelessly to a receiving circuit of another battery unit. The connection of the isolated communication circuit to the one or more battery units is explained in detail below.

Figure 6C:
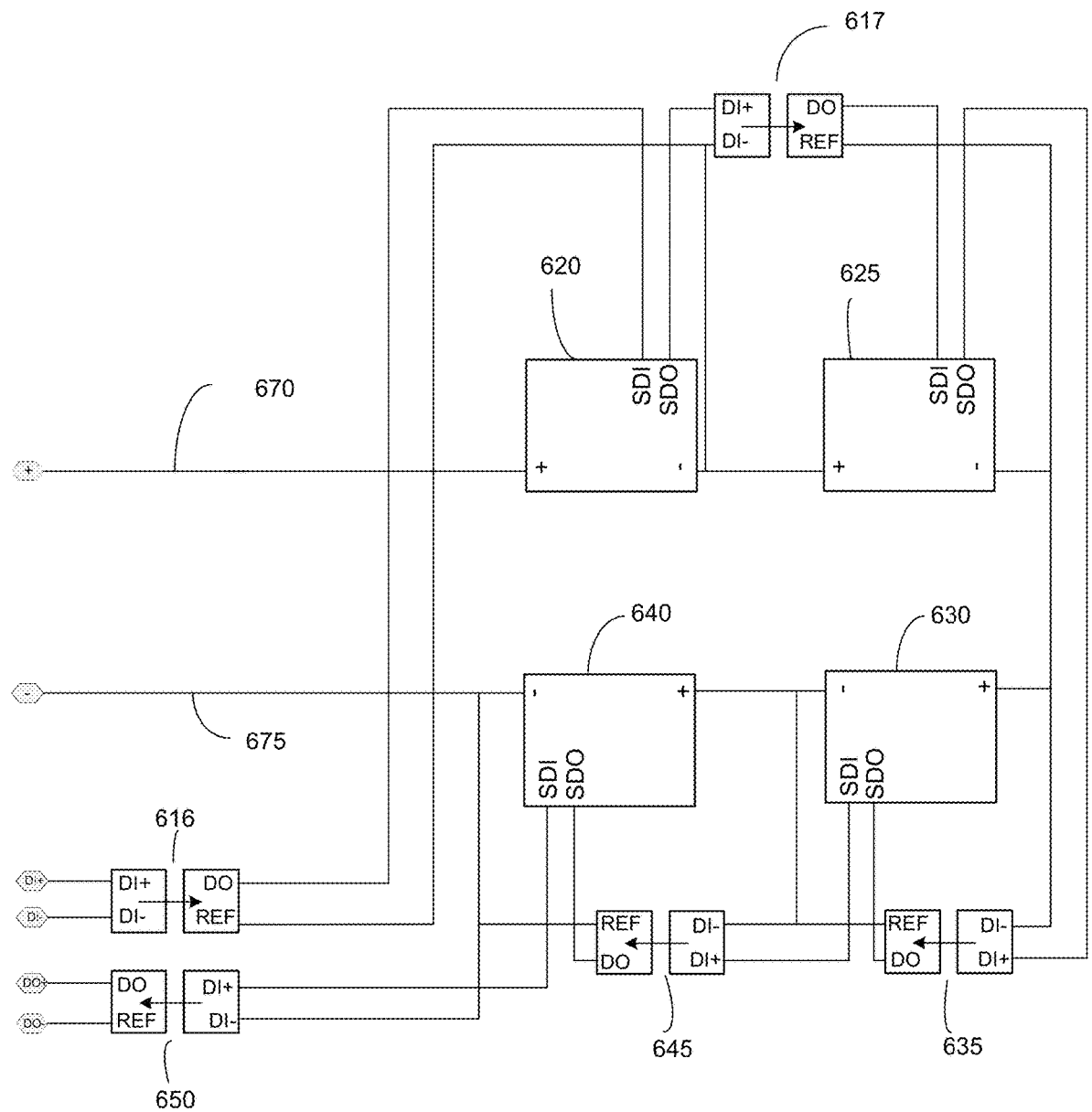
FIG. 6C illustrates the isolated communication system of FIG. 2 between different battery units, in accordance with an embodiment of the present invention.

FIG. 6C illustrates the isolated communication system between different battery units, in accordance with an embodiment of the present invention. An isolated communication circuit shown in FIGS. 6A-6B is connected to the battery units as shown in FIG. 6C. A first isolated communication circuit 616, a second isolated communication circuit 617, a third isolated communication circuit 635, a fourth isolated communication circuit 645, and a fifth isolated communication circuit 650 are connected to a first battery unit 620, a second battery units 625, a third battery unit 630, and a fourth battery unit 640. The battery units shown in FIG. 6C are connected in series and the battery units may be containers, racks, trays, modules, or a bundle of cells grouped together. For exemplary purposes, the battery units illustrated in FIG. 6C are considered as a bundle of cells connected in series. As shown, the isolated communication circuits may be connected to each of the battery units. By connecting the isolated communication circuits between different components of the energy store system (e.g., between different battery units and between battery units and a central controller), noise that might otherwise be introduced by the high voltage power lines can be reduced.

The isolated communication circuits are configured for transmitting communication signals received from controllers of the one or more battery units to the at least one controller (e.g., a centralized controller or a controller of the adjacent module or tray or rack or container) of the energy storage system and transmitting communication signals received from the at least one controller to the controllers of the one or more battery units. In some embodiments, the communication signal may include reference identifiers associated with the battery units. For example, the first isolated communication circuit 616 may receive a communication signal from the one or more controllers (e.g., a centralized controller), where the communication signal may include a reference identifier associated with the fourth battery unit 640. The first isolated communication circuit 616 may transmit the communication signal to an internal controller of the first battery unit 620 at the terminal SDI of the first battery unit 620. Upon receiving the communication signal, the controller of the first battery unit 620 may identify that the communication is not associated with the first battery unit and may relay the communication signal to the second isolated communication circuit 617 via the SDO terminal of the first battery unit 620. The communication signal may be relayed to the fourth battery unit 640 by the internal controllers of the second battery unit 625 and the third battery unit 630, via the third isolated communication circuit 635 and the fourth isolated communication circuit 645. In some embodiments, any of the internal controllers of the one or more battery units may initiate a communication signal and pass it on to the at least one controller (e.g., centralized controller). For example, the internal controller of the second battery unit 625 may initiate a communication signal associated with malfunctioning and pass the communication signal to the at least one controller via the third isolated communication circuit 635, the third battery unit 630, the fourth isolated communication circuit 645, and the fourth battery unit 640, where the communication signal may include the reference identifier of the second battery unit 625.

Figure 6D:
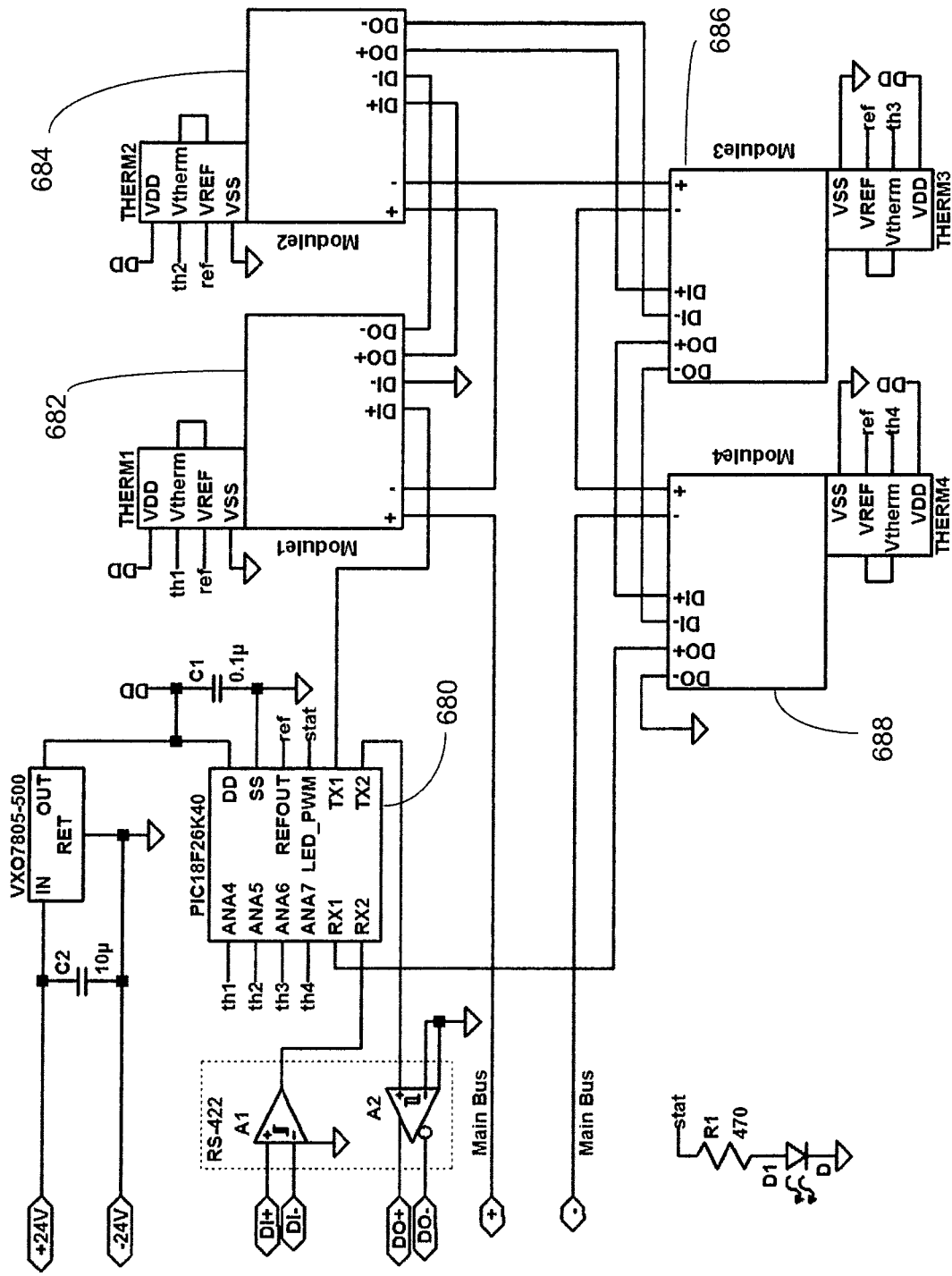
FIG. 6D illustrates the isolated communication system of FIG. 2 at a module level, in accordance with an embodiment of the present invention.

FIG. 6D illustrates the isolated communication system at a module level, in accordance with an embodiment of the present invention. As shown, a first module 682, a second module 684, a third module 686, and a fourth module 688 are connected in series. The number of modules shown in FIG. 6D are for illustrative purposes only. The one or more modules are connected to a controller 680 which may be a centralized controller or controller of an adjacent tray or an adjacent rack. Each of the one or more modules comprise one or more bundles of cells and the entire system illustrated in FIG. 6C may be a part of each of the one or more modules of FIG. 6D.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation. In addition, where possible, any terms expressed in the singular form herein are meant to also include the plural form and/or vice versa. As used herein, "at least one" shall mean "one or more" and these phrases are intended to be interchangeable. Accordingly, the terms "a" and/or "an" shall mean "at least one" or "one or more," even though the phrase "one or more" or "at least one" is also used herein.

What is claimed:

1. A protection system for selectively connecting one or more battery units of a battery system to a power system and disconnecting the one or more battery units of the battery system from the power system, via a bus, the protection system comprising:
   a bridge circuit configured to be connected between the bus and the one or more battery units, wherein the bridge circuit comprises:
      a first electrical path configured to be connected between a positive terminal of the bus and a positive terminal of the one or more battery units, the first electrical path comprising a first switch;
      a second electrical path configured to be connected between a negative terminal of the bus and a negative terminal of the one or more battery units, the second electrical path comprising a second switch; and
      a third electrical path connected in parallel to the first electrical path between the positive terminal of the bus and the positive terminal of the one or more battery units, the third electrical path comprising a third switch and an inductor;
      a fourth electrical path connected in parallel to the second electrical path between the negative terminal of the bus and the negative terminal of the one or more battery units, the fourth electrical path comprising a fourth switch and the inductor of the third electrical path; and
   at least one controller connected to the bridge circuit, wherein the at least one controller is configured to control a switching frequency of the third switch and a switching frequency of the fourth switch in order to control an impedance of the inductor while disconnecting the one or more battery units from the bus by:
      changing the third switch from an OFF state to an ON state;
      opening the first switch;
      changing the third switch from the ON state to a SWITCHING state;
      controlling the switching frequency of the third switch to increase the impedance of the inductor for decreasing a flow of current between the one or more battery units and the main bus;
      changing the third switch from the SWITCHING state to the OFF state;
      change the fourth switch from an OFF state to an ON state;
      open the second switch;
      change the fourth switch from the ON state to a SWITCHING state;
      control the switching frequency of the fourth switch to increase the impedance of the inductor for decreasing the flow of current between the one or more battery units and the main bus; and
      change the fourth switch from the SWITCHING state to the OFF state.

2. The protection system according to claim 1, wherein: the at least one controller is configured to control the switching frequency of the third switch in order to control the impedance of the inductor while connecting the one or more battery units to the bus via the bridge circuit by:
   changing the third switch from the OFF state to the SWITCHING state;
   controlling the switching frequency of the third switch to control the impedance of the inductor for gradually increasing a flow of current between the one or more battery units and the main bus; and
   closing of the first switch of the first electrical path between the positive terminal of the bus and the positive terminal of the one or more battery units.

3. The protection system according to claim 2, wherein the at least one controller controls the switching frequency of the third switch to control the impedance of the inductor to be at a first value and subsequently decrease the impedance of the inductor to a second value.

4. The protection system according to claim 2, wherein the at least one controller is further configured to:
   change the third switch from the SWITCHING state to the OFF state; and
   open a fifth switch of the third electrical path.

5. The protection system according to claim 1, wherein the fourth electrical path does not comprise the third switch of the third electrical path.

6. A method for selectively connecting one or more battery units of a battery system to a power system and disconnecting the one or more battery units of the battery system from the power system, via a bus, the method comprising:
   providing a bridge circuit configured to be connected between the bus and the one or more battery units, wherein the bridge circuit comprises:
      a first electrical path configured to be connected between a positive terminal of the bus and a positive terminal of the one or more battery units, the first electrical path comprising a first switch;
      a second electrical path configured to be connected between a negative terminal of the bus and a negative terminal of the one or more battery units, the second electrical path comprising a second switch; and
      a third electrical path connected in parallel to the first electrical path between the positive terminal of the bus and the positive terminal of the one or more battery units, the third electrical path comprising a third switch and an inductor;
      a fourth electrical path connected in parallel to the second electrical path between the negative terminal of the bus and the negative terminal of the one or more battery units, the fourth electrical path comprising a fourth switch and the inductor of the third electrical path; and
   controlling a switching frequency of the third switch and a switching frequency of the fourth switch in order to control an impedance of the inductor while disconnecting the one or more battery units from the bus by:
      changing the third switch from an OFF state to an ON state;
      opening the first switch;
      changing the third switch from the ON state to a SWITCHING state;

controlling the switching frequency of the third switch to increase the impedance of the inductor for decreasing a flow of current between the one or more battery units and the main bus;

changing the third switch from the SWITCHING state to the OFF state;

changing the fourth switch from an OFF state to an ON state;

opening the second switch;

changing the fourth switch from the ON state to a SWITCHING state;

controlling the switching frequency of the fourth switch to increase the impedance of the inductor for decreasing the flow of current between the one or more battery units and the main bus; and changing the fourth switch from the SWITCHING state to the OFF state.

7. The method of claim 6, wherein the method further comprises:

controlling the switching frequency of the third switch in order to control the impedance of the inductor while connecting the one or more battery units to the bus via the bridge circuit by:

changing the third switch from the OFF state to the SWITCHING state;

controlling the switching frequency of the third switch to control the impedance of the inductor for gradually increasing a flow of current between the one or more battery units and the main bus; and closing of the first switch of the first electrical path between the positive terminal of the bus and the positive terminal of the one or more battery units.

8. The method of claim 7, wherein the method comprises controlling the switching frequency of the third switch to control the impedance of the inductor to be at a first value and subsequently decrease the impedance of the inductor to a second value.

9. The method of claim 7, wherein the method further comprises:

change the third switch from the SWITCHING state to the OFF state; and open a fifth switch of the third electrical path.

10. The method of claim 6, wherein the fourth electrical path does not comprise the third switch of the third electrical path.

11. A system, the system comprising:

a bridge circuit configured to be connected between a bus and one or more battery units, wherein the bridge circuit comprises:

a first electrical path configured to be connected between a positive terminal of the bus and a positive terminal of the one or more battery units, the first electrical path comprising a first switch;

a second electrical path configured to be connected between a negative terminal of the bus and a negative terminal of the one or more battery units, the second electrical path comprising a second switch; and a third electrical path connected in parallel to the first electrical path between the positive terminal of the bus and the positive terminal of the one or more battery units, the third electrical path comprising a first semiconductor switch and an inductor;

a fourth electrical path connected in parallel to the second electrical path between the negative terminal of the bus and the negative terminal of the one or more battery units, the fourth electrical path comprising a second semiconductor switch and the inductor of the third electrical path; and at least one controller connected to the bridge circuit, wherein the at least one controller is configured to:

control a switching frequency of the first semiconductor switch and a switching frequency of the second semiconductor switch in order to control the impedance of the inductor while disconnecting the one or more battery units from the bus by:

changing the first semiconductor switch from an OFF state to an ON state;

opening the first switch;

changing the first semiconductor switch from the ON state to a SWITCHING state;

controlling the switching frequency of the first semiconductor switch to increase an impedance of the inductor for decreasing the flow of current between the one or more battery units and the main bus;

changing the first semiconductor switch from the SWITCHING state to the OFF state;

changing the second semiconductor switch from an OFF state to an ON state;

opening the second switch;

changing the second semiconductor switch from the ON state to a SWITCHING state;

controlling the switching frequency of the second semiconductor switch to increase the impedance of the inductor for decreasing the flow of current between the one or more battery units and the main bus; and changing the second semiconductor switch from the SWITCHING state to the OFF state.

* * * * *